United States Patent
Kim et al.

(10) Patent No.: US 9,748,499 B2
(45) Date of Patent: Aug. 29, 2017

(54) ORGANOMETALLIC COMPOUNDS AND ORGANIC LIGHT-EMITTING DEVICES COMPRISING THE SAME

(71) Applicants: SAMSUNG DISPLAY CO., LTD., Yongin, Gyeonggi-Do (KR); PUSAN NATIONAL UNIVERSITY INDUSTRY-UNIVERSITY COOPERATION FOUNDATION, Geumjeong-gu, Busan (KR)

(72) Inventors: Soung-Wook Kim, Yongin (KR); Jae-Hong Kim, Yongin (KR); Myeong-Suk Kim, Yongin (KR); Moon-Jae Lee, Yongin (KR); Sung-Ho Jin, Busan (KR)

(73) Assignees: Samsung Display Co., Ltd., Yongin-si (KR); Pusan National University Industry-University Cooperation Foundation, Busan (KR)

( * ) Notice: Subject to any disclaimer, the term of this patent is extended or adjusted under 35 U.S.C. 154(b) by 563 days.

(21) Appl. No.: 14/065,285

(22) Filed: Oct. 28, 2013

(65) Prior Publication Data

US 2014/0367650 A1 Dec. 18, 2014

(30) Foreign Application Priority Data

Jun. 12, 2013 (KR) .................. 10-2013-0067326

(51) Int. Cl.
*H01L 51/00* (2006.01)
*H01L 51/50* (2006.01)

(52) U.S. Cl.
CPC ...... *H01L 51/0085* (2013.01); *H01L 51/0052* (2013.01); *H01L 51/0058* (2013.01);
(Continued)

(58) Field of Classification Search
None
See application file for complete search history.

(56) References Cited

U.S. PATENT DOCUMENTS

| 7,544,426 B2 | 6/2009 | Kamatani et al. |
| 2006/0046095 A1 | 3/2006 | Ragini et al. |

(Continued)

FOREIGN PATENT DOCUMENTS

| KR | 2003-0059288 | 7/2003 |
| KR | 2003-0074631 | 9/2003 |

(Continued)

*Primary Examiner* — J. L. Yang
(74) *Attorney, Agent, or Firm* — Lewis Roca Rothgerber Christie LLP

(57) ABSTRACT

An organometallic compound represented by Formula 1 below is disclosed. An organic light-emitting device including at least one organometallic compound represented by Formula 1 is also disclosed.

18 Claims, 1 Drawing Sheet

Formula 1

(52) U.S. Cl.
CPC ...... *H01L 51/0061* (2013.01); *H01L 51/0072* (2013.01); *H01L 51/5016* (2013.01)

(56) References Cited

U.S. PATENT DOCUMENTS

| | | | |
|---|---|---|---|
| 2006/0177694 A1* | 8/2006 | Kamatani | C07F 15/004 428/690 |
| 2007/0235728 A1 | 10/2007 | Kathirgamanathan et al. | |
| 2008/0265758 A1 | 10/2008 | Han et al. | |
| 2009/0184634 A1 | 7/2009 | Kamatani et al. | |
| 2012/0025177 A1 | 2/2012 | Yoon et al. | |

FOREIGN PATENT DOCUMENTS

| | | |
|---|---|---|
| KR | 10-2004-0106779 | 12/2004 |
| KR | 10-0773523 | 11/2007 |
| KR | 10-1030011 | 4/2011 |
| KR | 10-2011-0131200 | 12/2011 |
| KR | 10-1193480 | 10/2012 |

\* cited by examiner

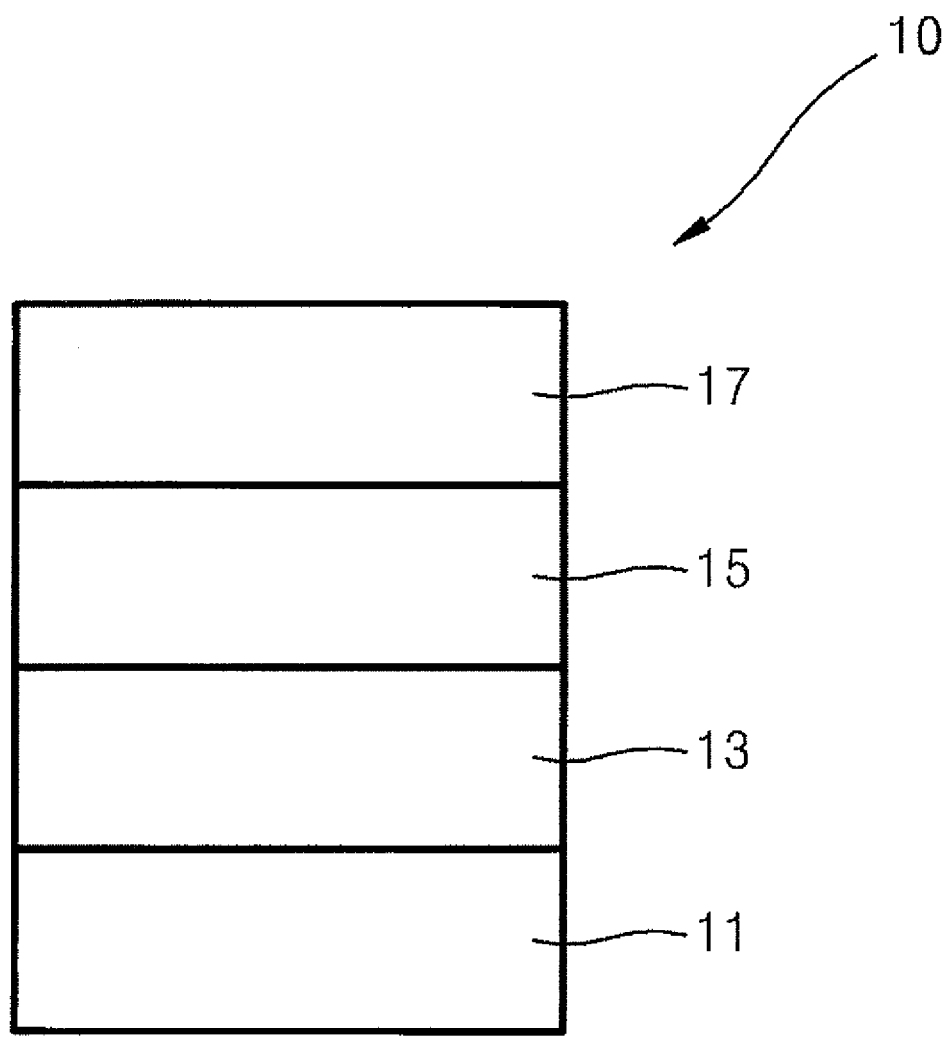

ORGANOMETALLIC COMPOUNDS AND ORGANIC LIGHT-EMITTING DEVICES COMPRISING THE SAME

CROSS-REFERENCE TO RELATED APPLICATION

This application claims priority to and the benefit of Korean Patent Application No. 10-2013-0067326, filed on Jun. 12, 2013, in the Korean Intellectual Property Office, the disclosure of which is incorporated herein in its entirety by reference.

BACKGROUND

1. Field

One or more aspects according to embodiments of the present invention relate to organometallic compounds for an organic light-emitting device (OLED) and OLEDs including the same.

2. Description of the Related Art

Organic light-emitting devices (OLEDs), which are self-emitting devices, have advantages, such as wide viewing angles, excellent contrast, quick response, high brightness, excellent driving voltage characteristics, and can provide multicolored images.

An OLED can have a structure including a substrate, an anode, a hole transport layer (HTL), an emission layer (EML), an electron transport layer (ETL), and a cathode which are sequentially stacked on the substrate. In this regard, the HTL, the EML, and the ETL are organic thin films formed of organic compounds.

Operating principles of an OLED having the above-described structure are as follows.

When a voltage is applied between the anode and the cathode, holes injected from the anode move to the EML via the HTL, and electrons injected from the cathode move to the EML via the ETL. The holes and electrons recombine in the EML to generate excitons. When the excitons drop from an excited state to a ground state, light is emitted.

SUMMARY

One or more aspects of embodiments according to the present invention are directed toward a high-quality organic light-emitting device.

Additional aspects will be set forth in part in the description which follows and, in part, will be apparent from the description, or may be learned by practice of the embodiments disclosed herein.

According to an embodiment of the present invention, an organometallic compound is represented by Formula 1 below:

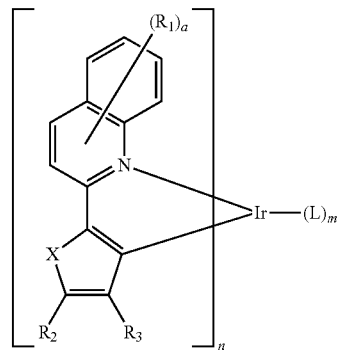

Formula 1 wherein, in Formula 1, $R_1$ is selected from a hydrogen atom, a deuterium atom, a halogen atom, a substituted or unsubstituted $C_1$-$C_{30}$ alkyl group, a substituted or unsubstituted $C_6$-$C_{20}$ aryl group, and a substituted or unsubstituted $C_1$-$C_{20}$ heteroaryl group;

a is an integer of 1 to 6, wherein when a is 2 or greater, Formula 1 includes a plurality of $R_1$s, and the $R_1$s are identical to or different from each other;

X is an oxygen atom or a sulfur atom;

$R_2$ and $R_3$ are each independently selected from, a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_1$-$C_{60}$ heteroaryl group, and —$CO(Q_1)$, $Q_1$ being a substituted or unsubstituted $C_1$-$C_{30}$ alkyl group or a substituted or unsubstituted $C_6$-$C_{60}$ aryl group, wherein $R_2$ and $R_3$ optionally bind to each other to form a substituted or unsubstituted saturated ring or a substituted or unsubstituted unsaturated ring;

n is an integer of 1 to 3, wherein when n is 2 or greater, Formula 1 includes a plurality of

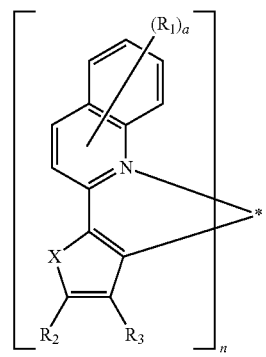

s, and each

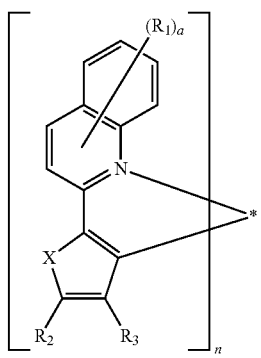

is identical to or different from each other;

L is an organic ligand; and m is an integer of 0 to 2, wherein when m is 2, Formula 1 includes two Ls, and the Ls are identical to or different from each other.

According to another aspect of the present invention, an organic light-emitting device (OLED) includes: a first electrode; a second electrode facing the first electrode; and an organic layer between the first electrode and the second electrode and including an emission layer, wherein the organic layer includes at least one of the organometallic compounds represented by Formula 1.

BRIEF DESCRIPTION OF THE DRAWINGS

These and/or other aspects will become apparent and more readily appreciated from the following description of the embodiments, taken in conjunction with the accompanying drawing, which is a schematic view of an organic light-emitting device according to an embodiment of the present invention.

DETAILED DESCRIPTION

Reference will now be made in detail to embodiments of the present invention, an example of which is illustrated in the accompanying drawing, wherein like reference numerals refer to like elements throughout. In this regard, the present embodiments may have different forms and should not be construed as being limited to the descriptions set forth herein. Accordingly, embodiments of the present invention are merely described below, by referring to the FIGURES, to explain aspects of the present invention. Also, in the context of the present application, when a first element is referred to as being "on" a second element, it can be directly on the second element or be indirectly on the second element with one or more intervening elements interposed therebetween. Expressions such as "at least one of," when preceding a list of elements, modify the entire list of elements and do not modify the individual elements of the list.

According to an embodiment of the present invention, an organometallic compound is represented by Formula 1 below:

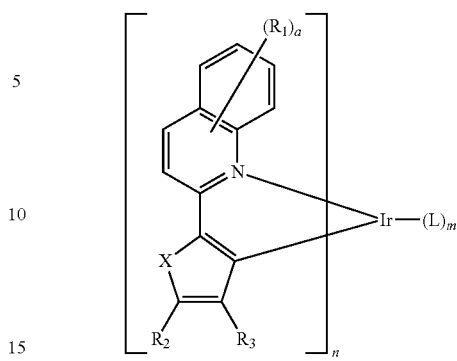

Formula 1

In Formula 1, $R_1$ may be selected from a hydrogen atom, a deuterium atom, a halogen atom, a substituted or unsubstituted $C_1$-$C_{30}$ alkyl group, a substituted or unsubstituted $C_6$-$C_{20}$ aryl group, and a substituted or unsubstituted $C_1$-$C_{20}$ heteroaryl group.

For example, in Formula 1, $R_1$ may be selected from a substituted or unsubstituted phenyl group, a substituted or unsubstituted pentalenyl group, a substituted or unsubstituted indenyl group, a substituted or unsubstituted naphthyl group, a substituted or unsubstituted azulenyl group, a substituted or unsubstituted heptalenyl group, a substituted or unsubstituted indacenyl group, a substituted or unsubstituted acenaphthyl group, a substituted or unsubstituted fluorenyl group, a substituted or unsubstituted spiro-fluorenyl group, a substituted or unsubstituted phenalenyl group, a substituted or unsubstituted phenanthrenyl group, a substituted or unsubstituted anthryl group, a substituted or unsubstituted fluoranthenyl group, a substituted or unsubstituted triphenylenyl group, a substituted or unsubstituted pyrenyl group, a substituted or unsubstituted chrysenyl group, a substituted or unsubstituted naphthacenyl group, a substituted or unsubstituted picenyl group, a substituted or unsubstituted perylenyl group, a substituted or unsubstituted pentaphenyl group, a substituted or unsubstituted hexacenyl group, a substituted or unsubstituted pyrrolyl group, a substituted or unsubstituted imidazolyl group, a substituted or unsubstituted pyrazolyl group, a substituted or unsubstituted pyridinyl group, a substituted or unsubstituted pyrazinyl group, a substituted or unsubstituted pyrimidinyl group, a substituted or unsubstituted pyridazinyl group, a substituted or unsubstituted isoindolyl group, a substituted or unsubstituted indolyl group, a substituted or unsubstituted indazolyl group, a substituted or unsubstituted purinyl group, a substituted or unsubstituted quinolinyl group, a substituted or unsubstituted benzoquinolinyl group, a substituted or unsubstituted phthalazinyl group, a substituted or unsubstituted naphthyridinyl group, a substituted or unsubstituted quinoxalinyl group, a substituted or unsubstituted quinazolinyl group, a substituted or unsubstituted cinnolinyl group, a substituted or unsubstituted carbazolyl group, a substituted or unsubstituted phenanthridinyl group, a substituted or unsubstituted acridinyl group, a substituted or unsubstituted phenanthrolinyl group, a substituted or unsubstituted phenazinyl group, a substituted or unsubstituted benzoxazolyl group, a substituted or unsubstituted benzoimidazolyl group, a substituted or unsubstituted furanyl group, a substituted or unsubstituted benzofuranyl group, a substituted or unsubstituted thiophenyl group, a substituted or unsubstituted benzothiophenyl group, a substituted or unsubstituted thiazolyl group, a substituted or unsubstituted isothiazolyl group, a substituted or unsubstituted benzothiazolyl group, a substituted or unsubstituted isoxazolyl group, a substituted or unsubstituted oxazolyl group, a substituted or unsubstituted triazolyl group, a substituted or unsubstituted tetrazolyl group, a substituted or unsubstituted oxadiazolyl group, a substituted or unsubstituted triazinyl group, a substituted or unsubstituted dibenzofuranyl group, a substituted or unsubstituted dibenzothiophenyl group, and a substituted or unsubstituted benzocarbazolyl group, but is not limited thereto.

In some embodiments, in Formula 1, $R_1$ may be selected from, a phenyl group, a naphthyl group, a phenanthryl group, an anthryl group, a pyrenyl group, a chrysenyl group, a fluorenyl group, a pyridyl group, a pyrimidyl group, a triazinyl group, a quinolinyl group, an isoquinolinyl group, a carbazolyl group, a dibenzofuranyl group, and a dibenzothiophenyl group; and a phenyl group, a naphthyl group, an anthryl group, a fluorenyl group, a dimethylfluorenyl group, a diphenylfluorenyl group, a carbazolyl group, a phenylcarbazolyl group, a pyridyl group, a pyrimidyl group, a pyrazinyl group, a pyridazinyl group, a triazinyl group, a quinolinyl group, an isoquinolinyl group, a carbazolyl group, a dibenzofuranyl group, and a dibenzothiophenyl group, each substituted with at least one of, a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, and a $C_1$-$C_{60}$ alkyl group;

a $C_1$-$C_{60}$ alkyl group substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, and a $C_1$-$C_{60}$ heteroaryl group; and a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, and a $C_1$-$C_{60}$ heteroaryl group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a phenyl group, a naphthyl group, an anthryl group, a fluorenyl group, a dimethylfluorenyl group, a diphenylfluorenyl group, a carbazolyl group, a phenylcarbazolyl group, a pyridyl group, a pyrimidyl group, a pyrazinyl group, a pyridazinyl group, a triazinyl group, a quinolinyl group, and an isoquinolinyl group, but is not limited thereto.

In Formula 1, $R_1$ may be selected from, a phenyl group, a naphthyl group, a phenanthryl group, and an anthryl group; and a phenyl group, a naphthyl group, a phenanthryl group, and an anthryl group, each substituted with at least one of, a deuterium atom, a fluorine atom, a cyano group, a nitro group, a methyl group, an ethyl group, an n-propyl group, an i-propyl group, an n-butyl group, an i-butyl group, and a t-butyl group;

a methyl group, an ethyl group, an n-propyl group, an i-propyl group, an n-butyl group, an i-butyl group, and a t-butyl group, each substituted with at least one of a deuterium atom and a fluorine atom;

a phenyl group, a naphthyl group, a phenanthryl group, and an anthryl group; and a phenyl group, a naphthyl group, a phenanthryl group, and an anthryl group, each substituted with at least one of a deuterium atom, a fluorine atom, a methyl group, an ethyl group, an n-propyl group, an i-propyl group, an n-butyl group, an i-butyl group, and a t-butyl group, but is not limited thereto.

In Formula 1, $R_1$ may be selected from, a phenyl group and a phenyl group substituted with at least one of a deuterium atom, a fluorine atom, a methyl group, an ethyl group, an n-propyl group, an i-propyl group, an n-butyl group, an i-butyl group, and a t-butyl group, but is not limited thereto.

In Formula 1, $R_1$ may be a phenyl group, but is not limited thereto.

In some embodiments, a denotes the number of $R_1$ groups being substituted at a quinoline ring in Formula 1, and a may be an integer of 1 to 6, but is not limited thereto. When a is 2 or greater, Formula 1 includes a plurality of $R_1$s, and the $R_1$s may be identical to or different from each other.

For example, in Formula 1, a may be an integer of 1 or 2, but is not limited thereto.

In some embodiments, X may be an oxygen atom or a sulfur atom in Formula 1, but is not limited thereto.

For example, in Formula 1, X may be a sulfur atom, but is not limited thereto.

In some embodiments, in Formula 1, $R_2$ and $R_3$ may be each independently selected from a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_1$-$C_{60}$ heteroaryl group, and —CO($Q_1$) (here, $Q_1$ is a substituted or unsubstituted $C_1$-$C_{30}$ alkyl group or a substituted or unsubstituted $C_6$-$C_{60}$ aryl group), wherein $R_2$ and $R_3$ may be optionally bound to each other to form a substituted or unsubstituted saturated ring or a substituted or unsubstituted unsaturated ring, but are not limited thereto.

For example, in Formula 1, $R_2$ and $R_3$ may be each independently selected from a hydrogen atom, a deuterium atom, a halogen atom, a substituted or unsubstituted $C_1$-$C_{60}$ alkyl group, a substituted or unsubstituted $C_6$-$C_{60}$ aryl group, a substituted or unsubstituted $C_1$-$C_{60}$ heteroaryl group, and —CO($Q_1$) (here, $Q_1$ is a substituted or unsubstituted methyl group, a substituted or unsubstituted ethyl group, a substituted or unsubstituted phenyl group, a substituted or unsubstituted naphthyl group, a substituted or unsubstituted phenanthryl group, a substituted or unsubstituted anthryl group, a substituted or unsubstituted pyridyl group, a substituted or unsubstituted pyrimidyl group, a substituted or unsubstituted triazinyl group, or a substituted or unsubstituted carbazolyl group, wherein $R_2$ and $R_3$ may be optionally bound to each other to form a substituted or unsubstituted $C_6$-$C_{20}$ aromatic ring or a substituted or unsubstituted $C_1$-$C_{20}$ heteroaromatic ring, but are not limited thereto.

For example, in Formula 1, $R_2$ and $R_3$ may be each independently selected from, a methyl group, an ethyl group, an n-propyl group, an i-propyl group, an n-butyl group, an i-butyl group, and a t-butyl group, each substituted with at least one of a hydrogen atom, a deuterium atom, a fluorine atom, a cyano group, a nitro group; a hydrogen atom, a deuterium atom, a fluorine atom, a cyano group, and a nitro group; and a phenyl group, a naphthyl group, a phenanthryl group, an anthryl group, a pyridyl group, a pyrimidyl group, a triazinyl group, a quinolinyl group, and an isoquinolinyl group, each substituted with at least one of a hydrogen atom, a deuterium atom, a fluorine atom, a cyano group, a nitro group, a methyl group, and an ethyl group, wherein $R_2$ and $R_3$ may be optionally bound to each other to form a substituted or unsubstituted $C_6$-$C_{20}$ aromatic ring or a substituted or unsubstituted $C_1$-$C_{20}$ heteroaromatic ring, but are not limited thereto.

For example, in Formula 1, $R_2$ and $R_3$ may be each independently selected from a hydrogen atom, a deuterium atom, a fluorine atom, and —$CF_3$, wherein $R_2$ and $R_3$ may be optionally bound to each other to form a $C_6$-$C_{20}$ aromatic ring, but are not limited thereto.

For example, in Formula 1, when $R_2$ and $R_3$ form a substituted or unsubstituted saturated ring or a substituted or unsubstituted unsaturated ring, an organometallic compound may be represented by Formula 1a below:

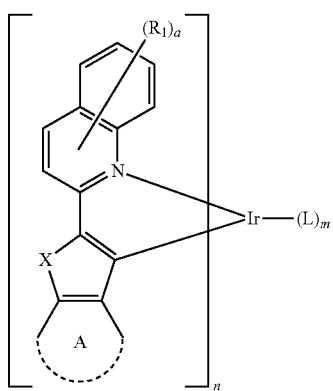

Formula 1a

In Formula 1a, ring A may be a substituted or unsubstituted $C_6$-$C_{20}$ aromatic ring or a substituted or unsubstituted $C_1$-$C_{20}$ heteroaromatic ring; and $R_1$, a, X, n, L, and m may be the same as described above, but are not limited thereto.

For example, in Formula 1a, ring A may be a $C_6$-$C_{20}$ aromatic ring substituted with at least one of a hydrogen atom, a deuterium atom, a fluorine atom, a cyano group, a nitro group, a methyl group, an ethyl group, and —$CF_3$ or a $C_1$-$C_{20}$ heteroaromatic ring substituted with at least one of a hydrogen atom, a deuterium atom, a fluorine atom, a cyano group, a nitro group, a methyl group, an ethyl group, and —$CF_3$; and $R_1$, a, X, n, L, and m may be the same as described above, but are not limited thereto.

For example, in Formula 1a, ring A may be a $C_6$-$C_{20}$ aromatic ring or a $C_1$-$C_{20}$ heteroaromatic ring; and $R_1$, a, X, n, L, and m may be the same as described above, but are not limited thereto.

For example, in Formula 1a, ring A may be selected from a phenylene, a napthylene, an anthracene, a pyridine, a pyrazine, and a triazine; and $R_1$, a, X, n, L, and m may be the same as described above, but are not limited thereto.

For example, in Formula 1a, ring A may be selected from a phenyl, a naphthylene, and an anthracene; and $R_1$, a, X, n, L, and m may be the same as described above, but are not limited thereto.

In some embodiments, n denotes the number of ligands that are represented by

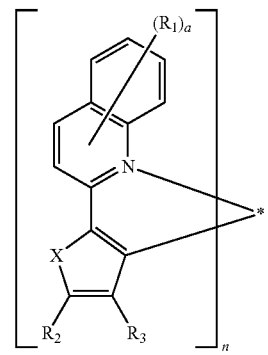

in Formula 1. For example, n may be an integer of 1 to 3, and when n is 2 or greater, Formula 1 includes a plurality (e.g., two or more) of

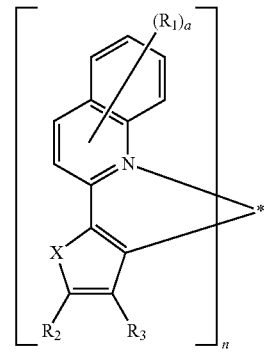

s, and the

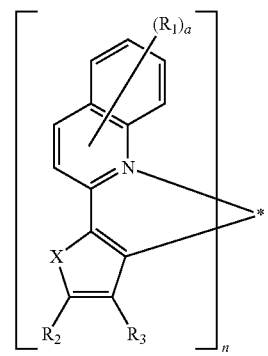

s may be identical to or different from each other, but n is not limited thereto.

For example, in Formula 1, n may be an integer of 2 or 3, but is not limited thereto.

In some embodiments, L may be an organic ligand in Formula 1, for example, L may be selected from a monodentate organic ligand, a bidentate organic ligand, a tridentate organic ligand, and a tetradentate organic ligand, but is not limited thereto.

For example, L may be represented by one selected from Formulae 2a to 2e below, but is not limited thereto:

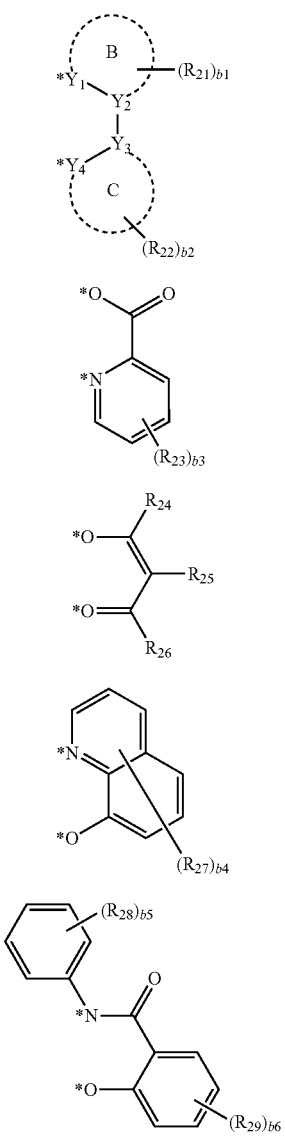

Formula 2a

Formula 2b

Formula 2c

Formula 2d

Formula 2e

In Formulae 2a to 2e, $Y_1$ to $Y_4$ may be each independently C or N, but is not limited thereto.

In Formulae 2a to 2e, a ring B and a ring C may be each independently selected from a $C_4$-$C_{20}$ alicyclic ring, a $C_2$-$C_{20}$ heteroalicyclic ring, a $C_6$-$C_{20}$ aromatic ring, and a $C_1$-$C_{20}$ heteroaromatic ring, but are not limited thereto. Here, $R_{21}$ and $R_{22}$ may each indicate a substituent group that is substituted at ring B or ring C.

For example, in Formulae 2a to 2e, ring B may be selected from a pyridine, a pyrazine, a pyrimidine, a pyrrole, an imidazole, an oxazole, a thiazole, an isoquinoline, a quinoline, a benzoimidazole, a benzoxazole, and a benzothiazole, but is not limited thereto.

For example, in Formulae 2a to 2e, ring C may be a phenyl group, but is not limited thereto.

In Formulae 2a to 2e, $R_{21}$ to $R_{29}$ may be each independently selected from a hydrogen atom, a deuterium atom, a halogen atom, a substituted or unsubstituted $C_1$-$C_{60}$ alkyl group, and a substituted or unsubstituted $C_6$-$C_{60}$ aryl group, but are not limited thereto.

For example, $R_{21}$ to $R_{29}$ may be each independently selected from a hydrogen atom, a deuterium atom, a fluorine atom, a methyl group, a t-butyl group, and —$CF_3$, but are not limited thereto.

In Formulae 2a to 2e, b1 to b6 are each independently an integer of 0 to 4, but are not limited thereto.

For example, in Formulae 2a to 2e, b1 to b6 may be each independently an integer of 0 to 2, but are not limited thereto.

In Formulae 2a to 2e, * is an Ir-binding site.

For example, L may be represented by one selected from Formulae 2a to 2c below, but is not limited thereto:

Formula 2a

Formula 2b

Formula 2c

In Formulae 2a to 2c, $Y_1$ to $Y_4$ may be each independently C or N;

a ring B may be selected from a pyridine, a pyrazine, a pyrimidine, a pyrrole, an imidazole, an oxazole, a thiazole, an isoquinoline, a quinoline, a benzoimidazole, a benzoxazole, and a benzothiazole;

a ring C may be a phenyl;

$R_{21}$ to $R_{26}$ may be each independently selected from a hydrogen atom, a deuterium atom, a fluorine atom, a methyl group, a t-butyl group, and —$CF_3$;

b1 to b3 may be each independently an integer of 0 to 2; and

* may be an Ir-binding site.

For example, L may be represented by one selected from Formulae 2g to 2i below, but is not limited thereto:

Formula 2g

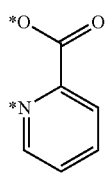

Formula 2h

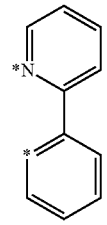

Formula 2i

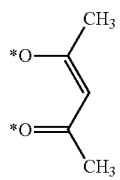

In Formulae 2g to 2i, * is an Ir-binding site.

In some embodiments, m denotes the number of Ls in Formula 1, and m may be an integer of 0 to 2, but is not limited thereto. When m is 2, Formula 1 includes two Ls, and the Ls may be identical to or different from each other.

For example, m may be an integer of 0 or 1 in Formula 1, but is not limited thereto.

In some embodiments, the organometallic compound represented by Formula 1 may be represented by one selected from Formulae 3a to 3d below, but is not limited thereto:

Formula 3a

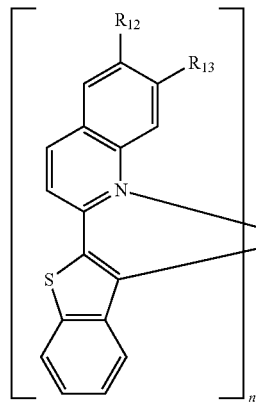

Formula 3b

Formula 3c

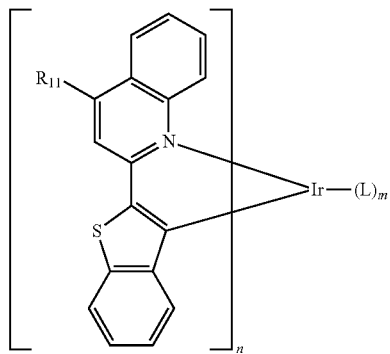

Formula 3d

In Formulae 3a to 3d, $R_{11}$ to $R_{13}$ may be each independently selected from, a phenyl group; and a phenyl group substituted with at least one of a deuterium atom, a fluorine atom, a methyl group, an ethyl group, an n-propyl group, an i-propyl group, an n-butyl group, an i-butyl group, and a t-butyl group;

$R_2$ and $R_3$ may be each independently selected from a hydrogen atom, a deuterium atom, a fluorine atom, and —$CF_3$;

n may be an integer of 2 or 3; and

L may be represented by one selected from Formulae 2g to 2i below:

Formula 2g

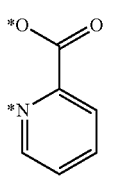

Formula 2h

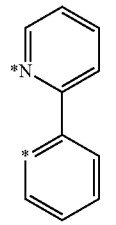

Formula 2i
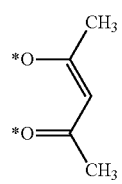
wherein, in Formulae 2g to 2i, * is an Ir-binding site, and m is an integer of 0 or 1.
In some embodiments, the organometallic compound represented by Formula 1 may be one of Compounds 1 to 9 below, but is not limited thereto:
Compound 1
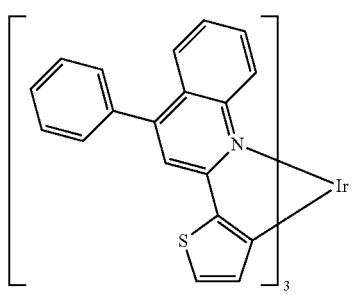
Compound 2
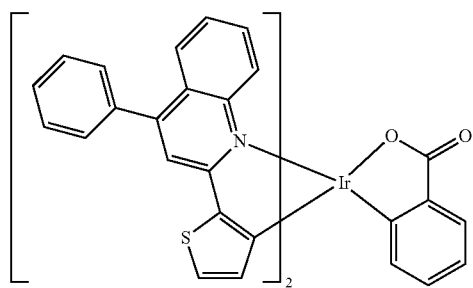
Compound 3
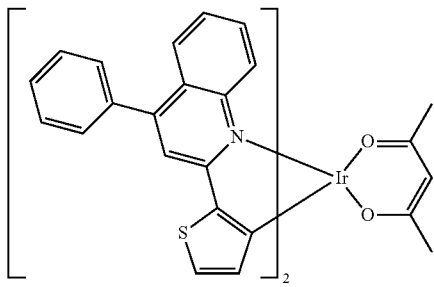
Compound 4
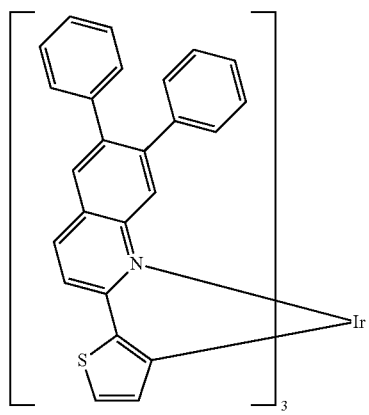
Compound 5
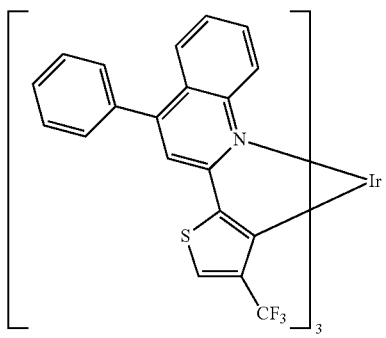
Compound 6
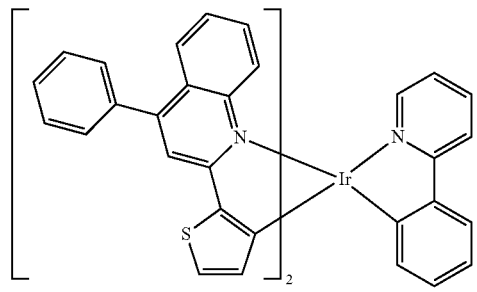
Compound 7
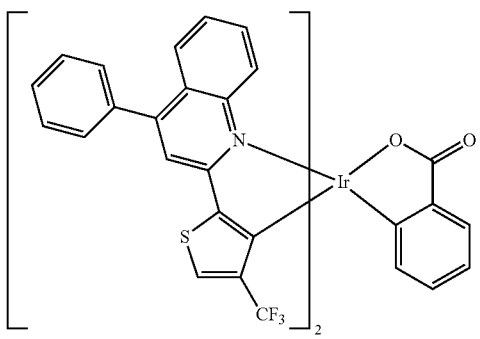

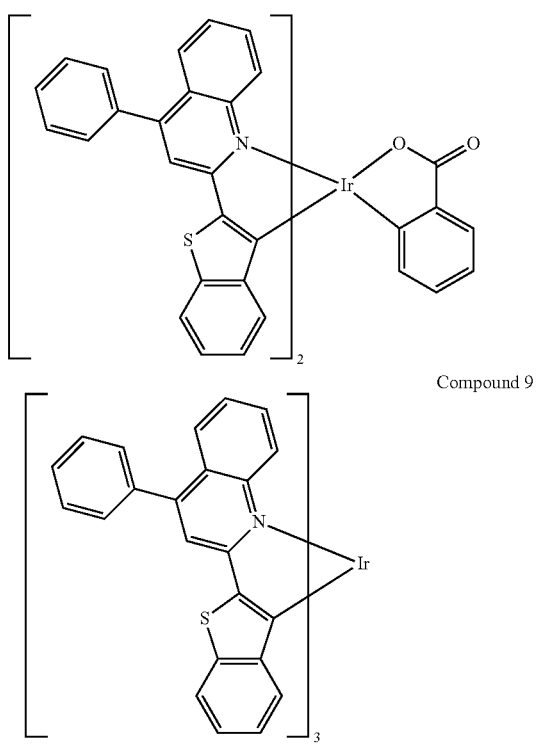

Compound 8

Compound 9

The organometallic compound represented by Formula 1 may control (or easily control) an electron density of a ligand of the organometallic compound by including both a donor and an acceptor in each of the ligands, and thus light emitted by the organometallic compound may be shifted toward a longer wavelength band. Also, an electron or hole trapping amount (or characteristic) of the organometallic compound may be controlled by the ligands to improve luminescence efficiency. Accordingly, an OLED including the organometallic compound may have a high efficiency, a low driving voltage, a high luminance, and a long lifespan.

The organometallic compound represented by Formula 1 may control (or easily control) an electron density of a ligand of the organometallic compound by including a quinoline in the ligand and may lower a lowest energy unoccupied molecular orbital (LUMO) energy level of the ligand as compared to a ligand including a pyridine. In this regard, a photoluminescence (PL) or electroluminescence (EL) spectrum of the organometallic compound may be shifted toward a longer wavelength band. Thus, the organometallic compound represented by Formula 1 may induce (or produce) red light emission with a high color-purity. Also, an electron or hole trapping amount (or characteristic) of the organometallic compound may be controlled and thus improve a luminescence efficiency of the OLED comprising the organometallic compound represented by Formula 1. In addition, when a quinoline is included in a ligand of the organometallic compound, less crystallization may occur (or crystallization may be less likely to occur) during deposition of an organic layer as compared to when an isoquinoline is included in a ligand.

As the organometallic compound represented by Formula 1 may include a substituent group at a number 4 location (or position) of the quinoline, crystallization of a deposition layer may be reduced during the deposition of the organic layer, and thus a decrease in efficiency by quenching may be prevented (or reduced). Also, by including a substituent at the number 4 location of the quinoline, an electron density at the quinoline (or part) may be controlled (or precisely controlled), and thus the color of the emitted light of the organometallic compound may be shifted toward either a short wavelength band or a long wavelength band. Also, an electron or hole trapping amount (or characteristic) of the organometallic compound may be controlled in the ligand, and thus a luminescence efficiency of the OLED may be improved.

The organometallic compound represented by Formula 1 may include a benzothiophene as a ligand, and thus controlling an amount of electron density of an organic ligand itself may be easier than when the organometallic compound includes a phenyl ligand. In this regard, the OLED including the organometallic compound may have a light-emitting dopant of a high efficiency with a high color-purity due to an electron density change of the quinoline ligand.

The organometallic compound represented by Formula 1 may be synthesized by using a known organic synthesis method. A synthesis method of the organometallic compound may be easily understood by one of ordinary skill in the art by referring to Examples, which will be described later.

The organometallic compound represented by Formula 1 may be used between a pair of electrodes of an OLED. For example, the organometallic compound may be used in an emission layer.

According to another aspect of the present invention, provided is an OLED including a first electrode, a second electrode disposed opposite to the first electrode, and an organic layer disposed between the first electrode and the second electrode, wherein the organic layer includes at least one of the organometallic compounds of Formula 1 described above.

As used herein, "(for example, the organic layer) including at least one organometallic compound" means that "(the organic layer) including one of the organometallic compounds of Formula 1 above, or at least two different organometallic compounds of Formula 1 above".

The organic layer may include at least one of a hole injection layer (HIL), a hole transport layer (HTL), a functional layer ("H-functional layer") having both hole injection and hole transport capabilities, a buffer layer, an electron blocking layer (EBL), an emission layer (EML), a hole blocking layer (HBL), an electron transport layer (ETL), an electron injection layer (EIL), and a functional layer ("E-functional layer") having both electron injection and electron transport capabilities.

As used herein, the term "organic layer" refers to a single layer and/or a plurality of layers disposed between the first and second electrodes of the OLED.

The organic layer includes an EML, and the organometallic compound represented by Formula 1 may be included in the EML. The EML including the organometallic compound may emit light that is generated according to a phosphorescent emission mechanism.

In some embodiments, the organometallic compound included in the EML of the OLED may serve as a dopant, and the EML may further include a host. Types (or examples) of the host will be described later.

FIG. 1 is a schematic cross-sectional view of an OLED 10 according to an embodiment of the present invention. Hereinafter, a structure of an OLED according to an embodiment of the present invention and a method of manufacturing the same will be described with reference to FIG. 1.

The substrate 11 may be any suitable substrate that is used in existing OLEDs. In some embodiments, the substrate 11 may be a glass substrate or a transparent plastic substrate with strong mechanical strength, thermal stability, transparency, surface smoothness, ease of handling, and water resistance.

The first electrode 13 may be formed by depositing or sputtering a first electrode-forming material on the substrate 11. When the first electrode 13 is an anode, a material having a high work function may be used as the first electrode-forming material to facilitate hole injection. The first electrode 13 may be a reflective electrode or a transmission electrode (e.g., a transparent electrode). Transparent and conductive materials such as indium tin oxide (ITO), indium zinc oxide (IZO), tin oxide ($SnO_2$), and zinc oxide (ZnO) may be used to form the first electrode 13. The first electrode 13 may be formed as a reflective electrode using magnesium (Mg), aluminum (Al), aluminum-lithium (Al—Li), calcium (Ca), magnesium-indium (Mg—In), magnesium-silver (Mg—Ag), or the like.

The first electrode 13 may have a single-layer structure or a multi-layer structure including at least two layers. For example, the first electrode 13 may have a three-layered structure of ITO/Ag/ITO, but is not limited thereto.

The organic layer 15 may be disposed on the first electrode 13.

The organic layer 15 may include a HIL, a HTL, a buffer layer, an EML, an ETL, and an EIL.

The HIL may be formed on the first electrode 13 by vacuum deposition, spin coating, casting, Langmuir-Blodgett (LB) deposition, or the like.

When the HIL is formed using vacuum deposition, vacuum deposition conditions may vary depending on the compound that is used to form the HIL, and the desired structure and thermal properties of the HIL to be formed. For example, vacuum deposition may be performed at a temperature of about 100° C. to about 500° C., a pressure of about $10^{-8}$ torr to about $10^{-3}$ torr, and a deposition rate of about 0.01 to about 100 Å/sec. However, the deposition conditions are not limited thereto.

When the NIL is formed using spin coating, the coating conditions may vary depending on the compound that is used to form the HIL, and the desired structure and thermal properties of the HIL to be formed. For example, the coating rate may be in the range of about 2000 rpm to about 5000 rpm, and a temperature at which heat treatment is performed to remove a solvent after coating may be in the range of about 80° C. to about 200° C. However, the coating conditions are not limited thereto.

The HIL may be formed of any suitable material that is commonly used to form a HIL. Non-limiting examples of the material that can be used to form the HIL include N,N'-diphenyl-N,N'-bis-[4-(phenyl-m-tolyl-amino)-phenyl]-biphenyl-4,4'-diamine, (DNTPD), a phthalocyanine compound such as copper phthalocyanine, 4,4',4''-tris(3-methylphenylphenylamino)triphenylamine (m-MTDATA), N,N'-di(1-naphthyl)-N,N'-diphenylbenzidine (NPB), TDATA, 2T-NATA, polyaniline/dodecylbenzenesulfonic acid (Pani/DBSA), poly(3,4-ethylenedioxythiophene)/poly (4-styrenesulfonate) (PEDOT/PSS), polyaniline/camphor sulfonic acid (Pani/CSA), and polyaniline/poly(4-styrenesulfonate (PANI/PSS):

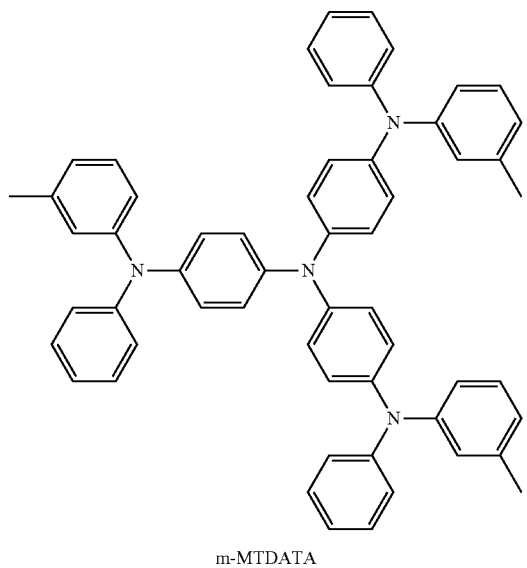

m-MTDATA

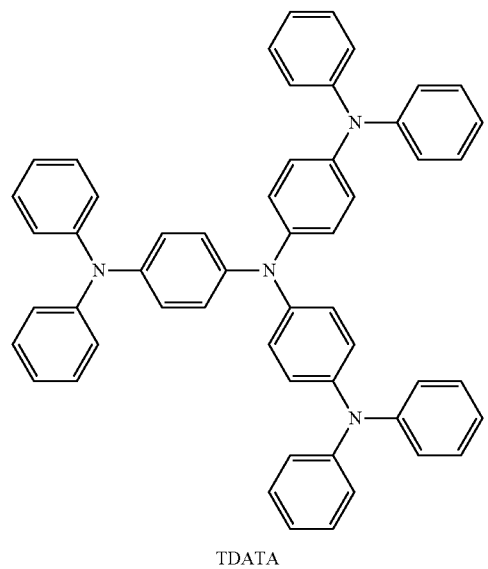

TDATA

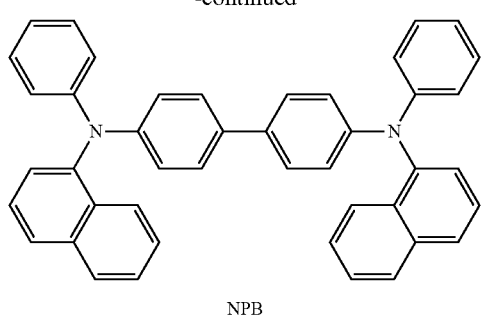

NPB

A thickness of the HTL may be from about 50 Å to about 2000 Å, and in some embodiments, may be from about 100 Å to about 1500 Å. When the thickness of the HTL is within either of the foregoing ranges, the HTL may have good hole transporting ability without a substantial increase in driving voltage.

The H-functional layer (having both hole injection and hole transport capabilities) may contain at least one material from each group of the hole injection layer materials and hole transport layer materials. The thickness of the H-functional layer may be from about 500 Å to about 10,000 Å, and in some embodiments, may be from about 100 Å to about 1,000 Å. When the thickness of the H-functional layer is within either of the foregoing ranges, the H-functional layer may have good hole injection and transport capabilities without a substantial increase in driving voltage.

At least one layer of the HIL, HTL, and H-functional layer may include at least one of a compound represented by Formula 300 and a compound represented by Formula 301 below:

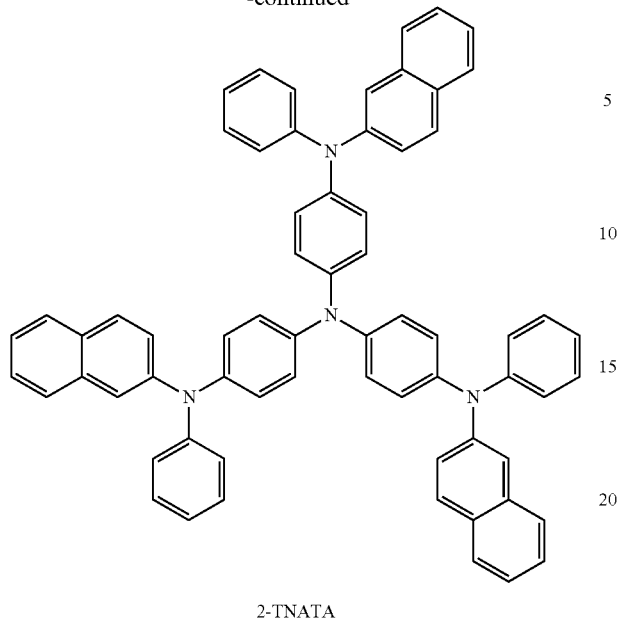

2-TNATA

A thickness of the HIL may be from about 100 Å to about 10000 Å, and in some embodiments, may be from about 100 Å to about 1000 Å. When the thickness of the HIL is within either of the foregoing ranges, the HIL may have good hole injecting ability without a substantial increase in driving voltage.

Then, a HTL may be formed on the HIL by using vacuum deposition, spin coating, casting, LB deposition, or the like. When the HTL is formed using vacuum deposition or spin coating, the conditions for deposition and coating may be similar to those for the formation of the HIL, though the conditions for the deposition and coating may vary depending on the material that is used to form the HTL Non-limiting examples of suitable known hole transport materials are carbazole derivatives, such as N-phenylcarbazole or polyvinylcarbazole, N,N'-bis(3-methylphenyl)-N,N'-diphenyl-[1,1-biphenyl]-4,4'-diamine (TPD), 4,4',4"-tris(N-carbazolyl)triphenylamine (TCTA), and N,N'-di(1-naphthyl)-N,N'-diphenylbenzidine) (NPB).

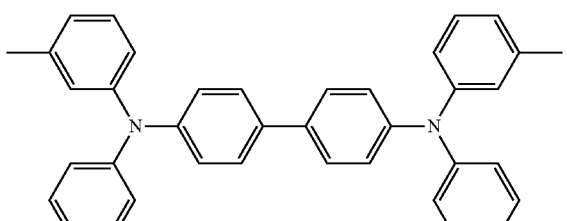

TPD

Formula 300

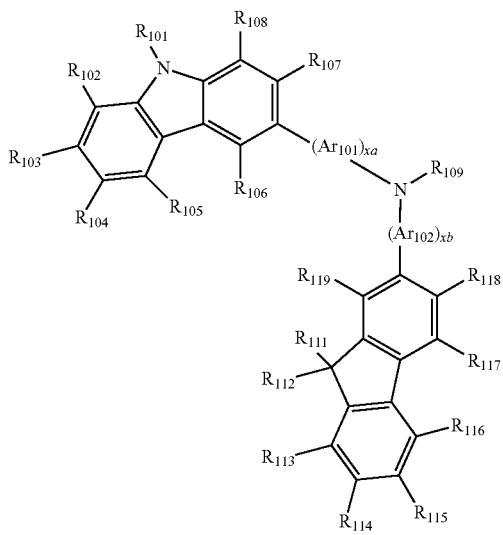

-continued

Formula 301

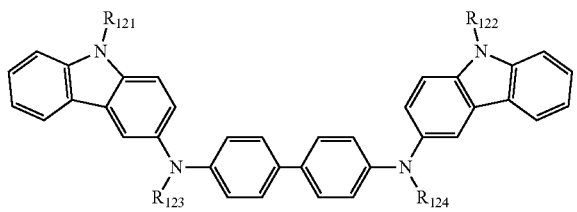

In Formula 300, $Ar_{101}$ and $Ar_{102}$ may be each independently a substituted or unsubstituted $C_6$-$C_{60}$ arylene group. For example, $Ar_{101}$ and $Ar_{102}$ may be each independently one selected from, a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthrylene group, a fluoranthenylene group, a triphenylenylene group, a pyrenylene group, a chrysenylenylene group, a naphthacenylene group, a picenylene group, a perylenylene group, and a pentacenylene group; and a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthrylene group, a fluoranthenylene group, a triphenylenylene group, a pyrenylene group, a chrysenylenylene group, a naphthacenylene group, a picenylene group, a perylenylene group, and a pentacenylene group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_2$-$C_{10}$ heterocyclo alkyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_1$-$C_{60}$ heteroaryl group.

In Formula 300, xa and xb may be each independently an integer of 0 to 5, or an integer of 0, 1, or 2. For example, xa may be 1, and xb may be 0, but xa and xb are not limited thereto.

In Formulae 300 and 301, $R_{101}$ to $R_{108}$, $R_{111}$ to $R_{119}$, and $R_{121}$ to $R_{124}$ may be each independently a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_5$-$C_{60}$ aryl group, a substituted or unsubstituted $C_5$-$C_{60}$ aryloxy group, or a substituted or unsubstituted $C_5$-$C_{60}$ arylthio group. For example, $R_{101}$ to $R_{108}$, $R_{111}$ to $R_{119}$, and $R_{121}$ to $R_{124}$ may be each independently one selected from, a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (e.g., a methyl group, an ethyl group, a propyl group, a butyl group, a pentyl group, a hexyl group, etc.), and a $C_1$-$C_{10}$ alkoxy group (e.g., a methoxy group, an ethoxy group, a propoxy group, a butoxy group, a pentoxy group, etc.);

a $C_1$-$C_{10}$ alkyl group and a $C_1$-$C_{10}$ alkoxy group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a naphthyl group, an anthryl group, a fluorenyl group, and a pyrenyl group; and a phenyl group, a naphthyl group, an anthryl group, a fluorenyl group, and a pyrenyl group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, and a $C_1$-$C_{10}$ alkoxy group, but are not limited thereto.

In Formula 300, $R_{109}$ may be one selected from, a phenyl group, a naphthyl group, an anthryl group, a biphenyl group, and a pyridyl group; and a phenyl group, a naphthyl group, an anthryl group, a biphenyl group, and a pyridyl group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{20}$ alkyl group, and a substituted or unsubstituted $C_1$-$C_{20}$ alkoxy group.

In some embodiments, the compound represented by Formula 300 may be represented by Formula 300A below, but is not limited thereto:

Formula 300A

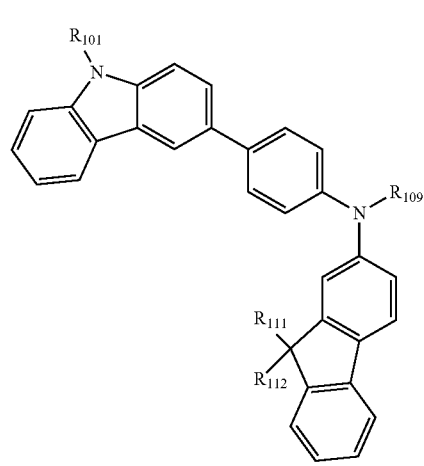

In Formula 300A, descriptions of $R_{101}$, $R_{111}$, $R_{112}$, and $R_{109}$ are the same as described above.

For example, at least one of the HIL, HTL, and H-functional layer may include at least one of Compounds 301 to 320, but is not limited thereto:

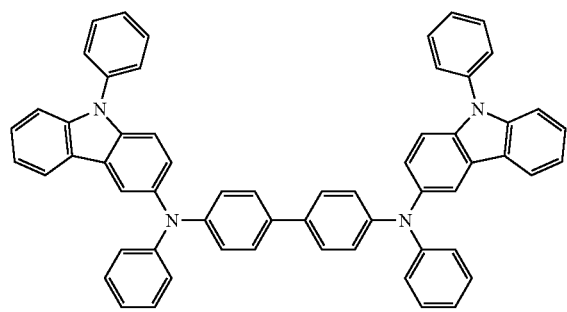
301
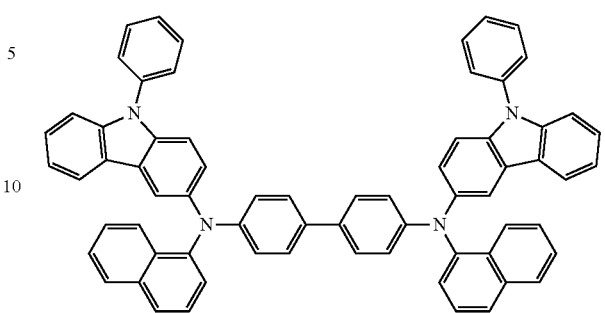
305
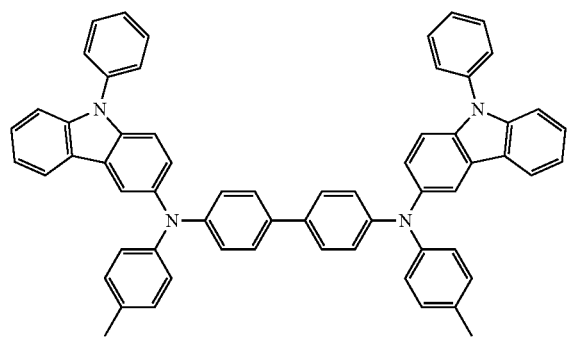
302
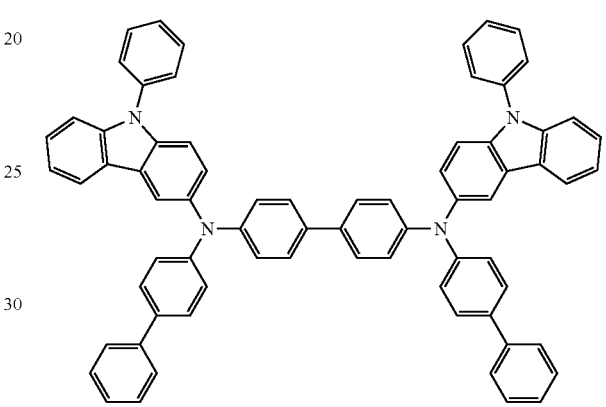
306
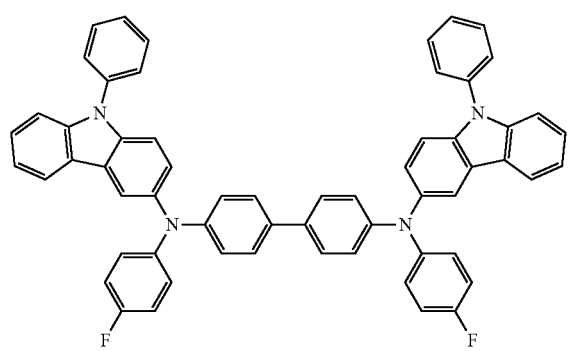
303
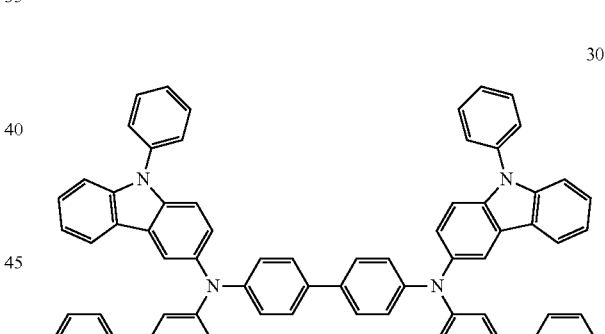
307
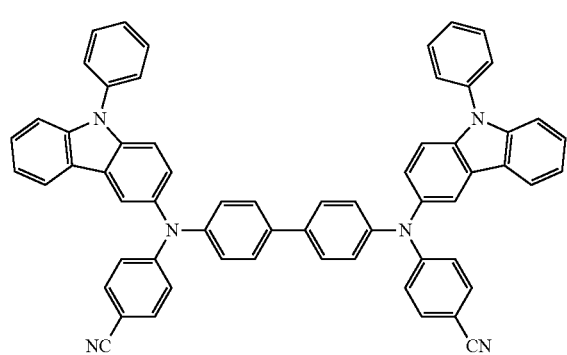
304
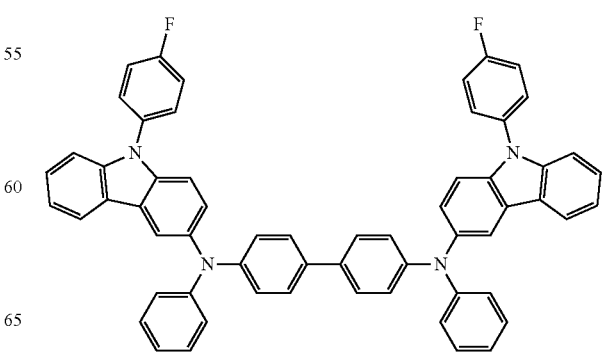
308

309
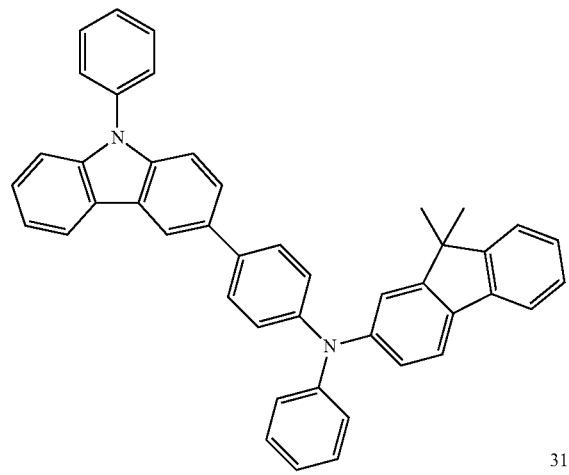
310
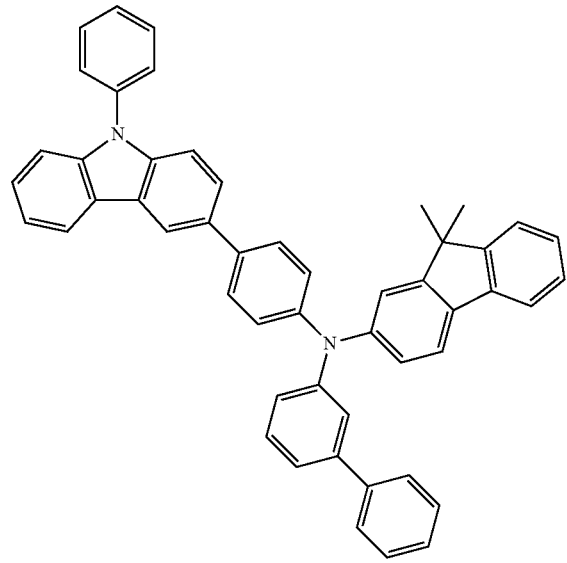
311
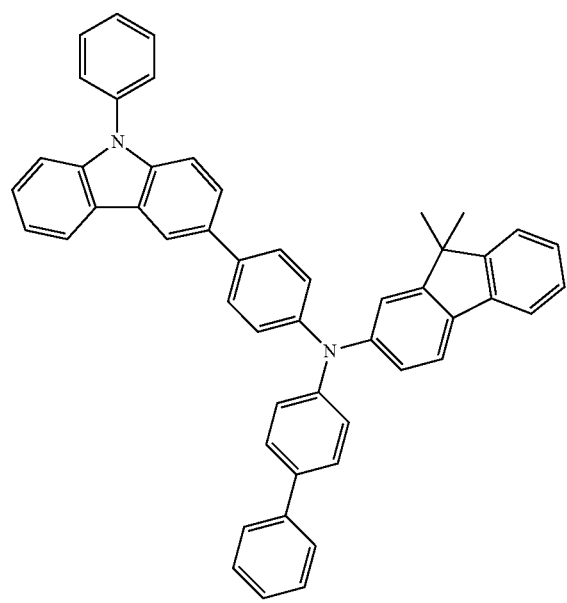
312
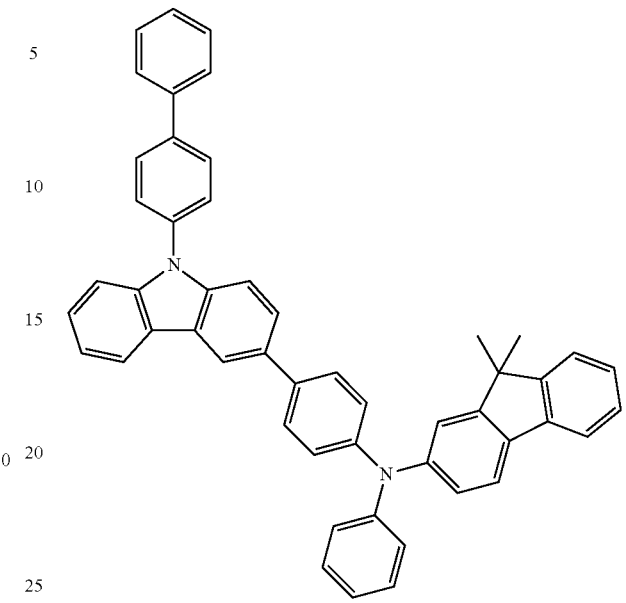
313
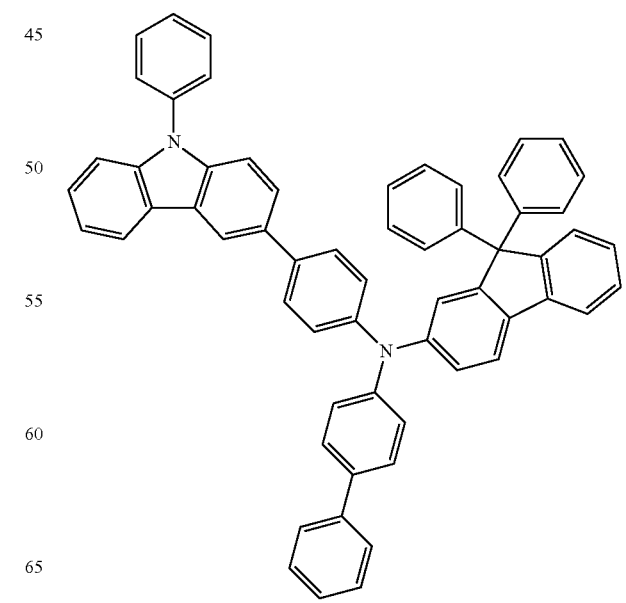

314
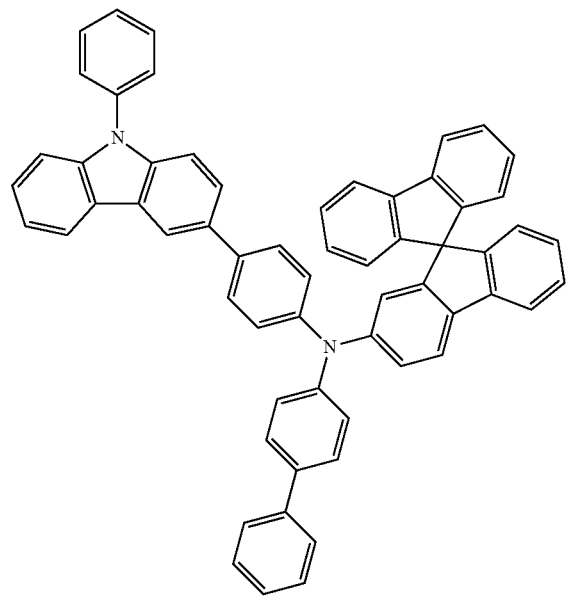
315
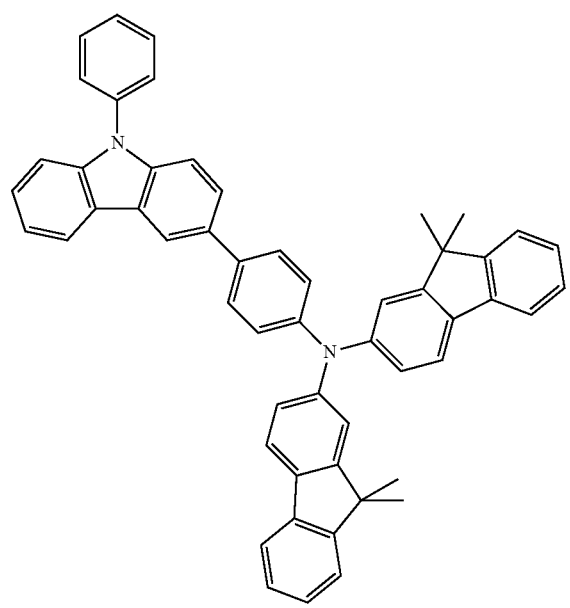
316
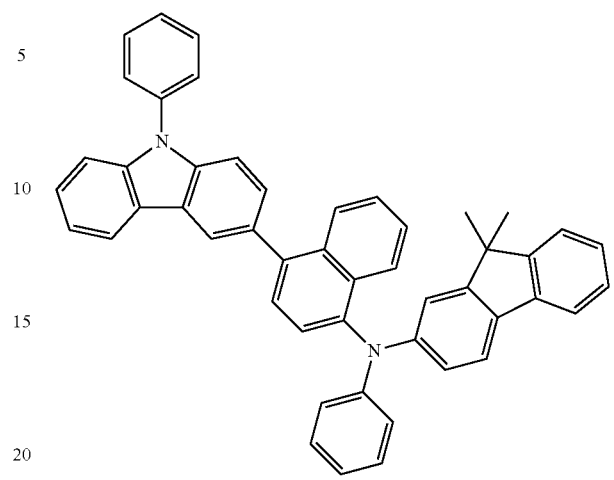
317
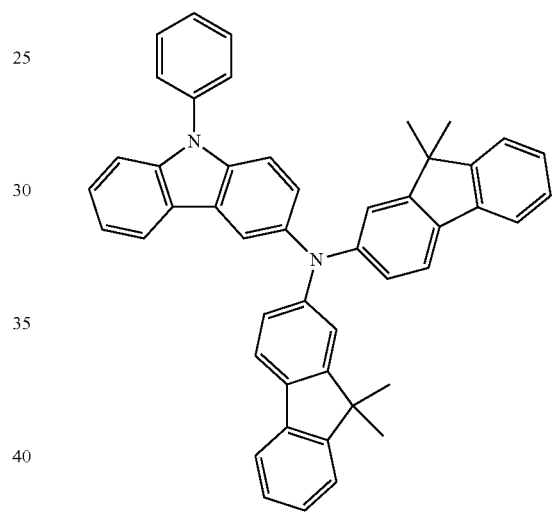
318
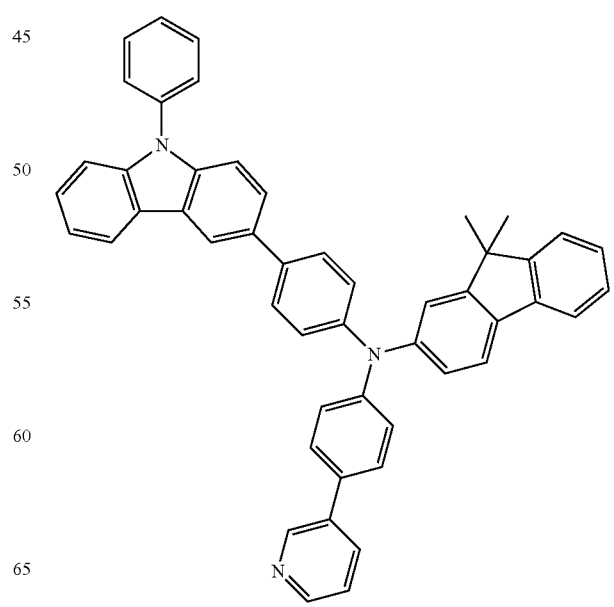

-continued

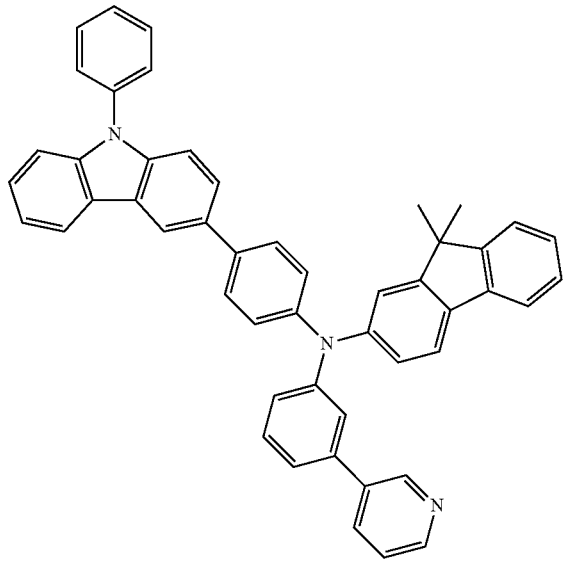
319

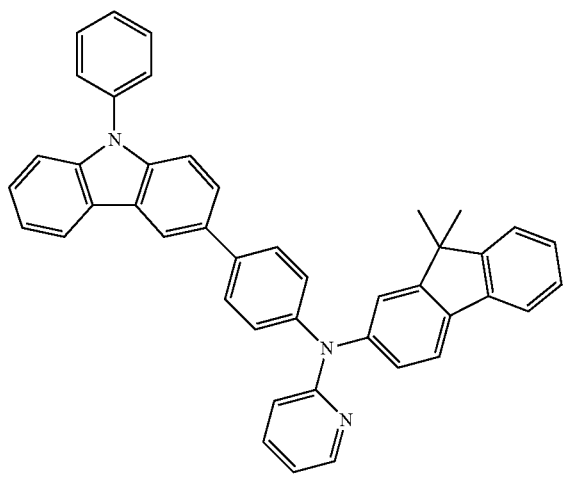
320

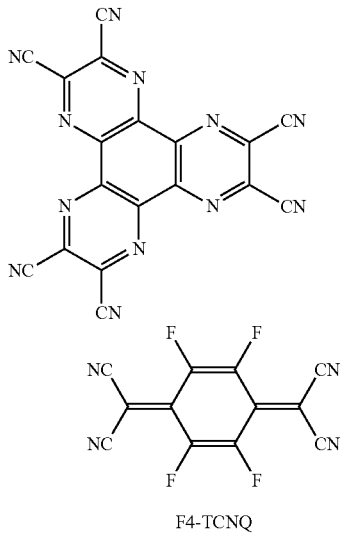
Compound 200

F4-TCNQ

The at least one of the HIL, HTL and H-functional layer may further include a charge-generating material in addition to a known hole injection material, a known hole transport material, and/or a material having both hole injecting and transporting capabilities as described above, for higher conductivity.

The charge-generating material may be one of, for example, quinone derivatives, metal oxides, and cyano-containing compounds, but the charge-generating material is not limited thereto. For example, non-limiting examples of the charge-generating material are quinone derivatives such as tetracyanoquinone dimethane (TCNQ), 2,3,5,6-tetra-fluoro-tetracyano-1,4-benzoquinonedimethane (F4TCNQ; shown below), and the like; metal oxides such as tungsten oxide, molybdenum oxide, and the like; and cyano-containing compounds such as Compound 200 below:

When the HIL, HTL, or H-functional layer further includes a charge-generating material, the charge-generating material may be homogeneously dispersed or inhomogeneously distributed in the layer.

A buffer layer may be disposed between at least one of the HIL, HTL, and H-functional layer, and the EML. The buffer layer may compensate for an optical resonance distance of light according to a wavelength of the light emitted from the EML, and thus may increase efficiency. The buffer layer may include any suitable hole injecting material or hole transporting material that are widely known. In some other embodiments, the buffer layer may include the same (or substantially the same) material as one of the materials included in the HIL, HTL, and H-functional layer that underlie the buffer layer.

Then, an EML may be formed on the HTL, H-functional layer, or buffer layer by vacuum deposition, spin coating, casting, LB deposition, or the like. When the EML is formed using vacuum deposition or spin coating, the deposition and coating conditions may be similar to those for the formation of the HIL, though the conditions for deposition and coating may vary depending on the material that is used to form the EML.

When the OLED is a full-colored OLED, the EML may be patterned into a red EML, a green EML, and a blue EML. In some embodiments, the EML may emit white light by stacking at least two of a red EML, a green EML, and a blue EML.

The EML may include the organometallic compound (e.g., as a dopant) represented by Formula 1 as described above and may further include a suitable known dopant and host.

Non-limiting examples of a known host are Alq$_3$, 4,4'-N, N'-dicarbazole-biphenyl (CBP), poly(n-vinylcarbazole) (PVK), 9,10-di(naphthalene-2-yl)anthracene (ADN), TCTA, 1,3,5-tris(N-phenylbenzimidazole-2-yl)benzene (TPBI), 3-tert-butyl-9,10-di-2-naphthylanthracene (TBADN), E3, distyrylarylene (IDSA), dmCBP (shown below), mCP (shown below), OXD-7 (shown below) and Compounds 501 to 509 below:

-continued
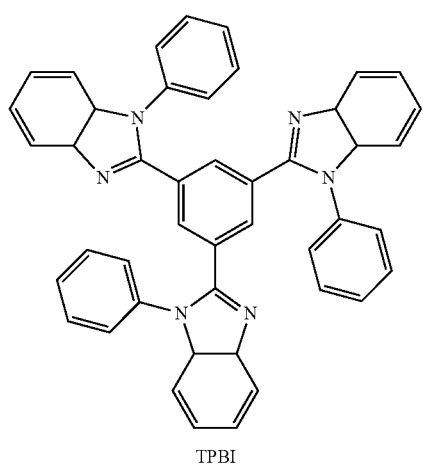
TPBI
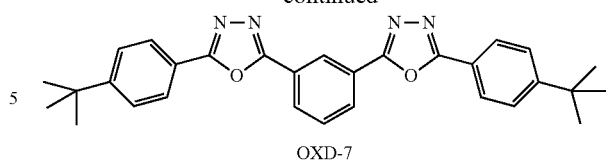
OXD-7
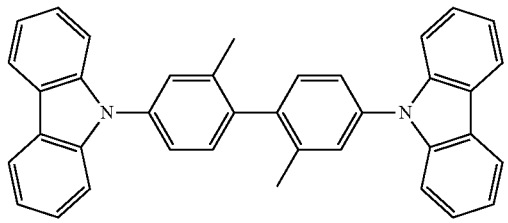
dmCBP
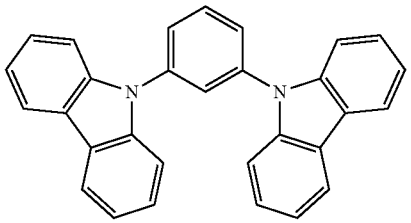
TBADN
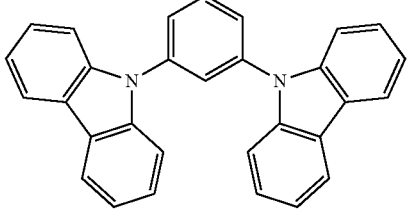
501
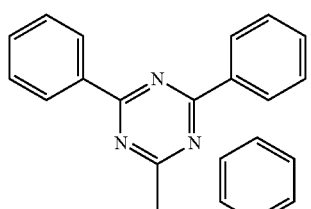
E3
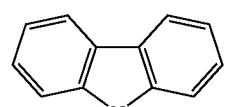
PVK
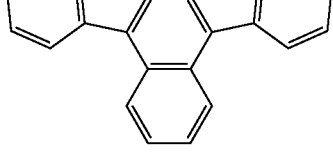
mCP
502
503

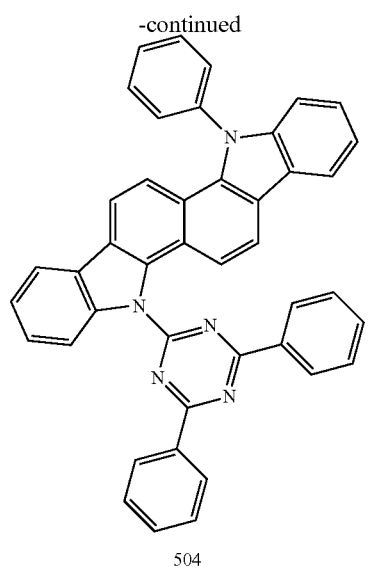
504
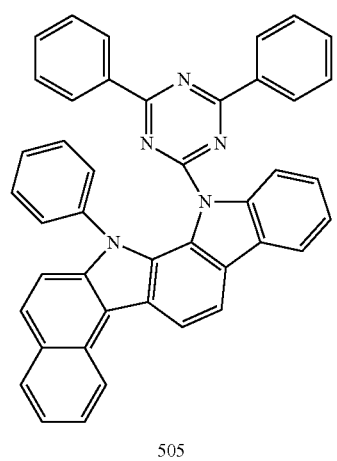
505
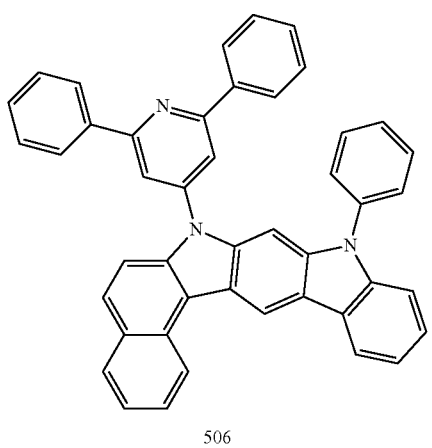
506
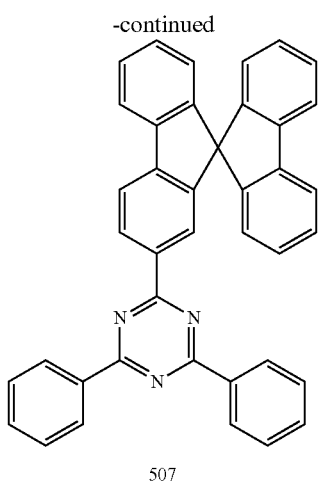
507
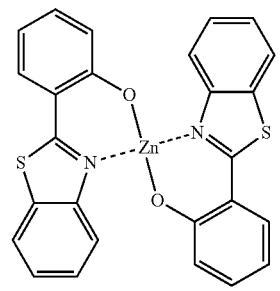
508
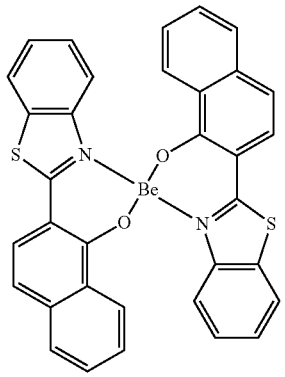
509
In some embodiments, the host is an anthracene-based compound represented by Formula 400 below:
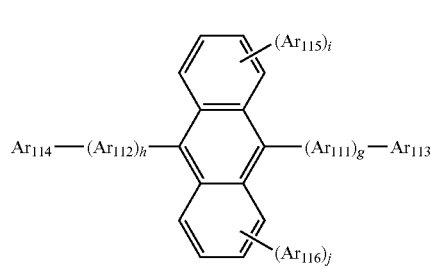
Formula 400
In Formula 400,
$Ar_{111}$ and $Ar_{112}$ may be each independently a substituted or unsubstituted $C_5$-$C_{60}$ arylene group;

$Ar_{113}$ to $Ar_{116}$ may be each independently a substituted or unsubstituted $C_1$-$C_{10}$ alkyl group or a substituted or unsubstituted $C_5$-$C_{60}$ aryl group; and g, h, i and j may be each independently an integer of 0 to 4.

For example, in Formula 400, $Ar_{111}$ and $Ar_{112}$ may be each independently, a phenylene group, a naphthylene group, a phenanthrenylene group, a fluorenylene group, or a pyrenylene group; or a phenylene group, a naphthylene group, a phenanthrenylene group, a fluorenylene group, or a pyrenylene group, each substituted with at least one of a phenyl group, a naphthyl group, and an anthryl group, but is not limited thereto.

In Formula 400, g, h, i and j may be each independently an integer of 0, 1, or 2.

In Formula 400, $Ar_{113}$ to $Ar_{116}$ may be each independently one selected from, a $C_1$-$C_{10}$ alkyl group substituted with at least one of a phenyl group, a naphthyl group, and an anthryl group;

a phenyl group, a naphthyl group, an anthryl group, a pyrenyl group, a phenanthrenyl group, and a fluorenyl group;

a phenyl group, a naphthyl group, an anthryl group, a pyrenyl group, a phenanthrenyl group, and a fluorenyl group, each substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a pyrenyl group, a phenanthrenyl group, and a fluorenyl group; and

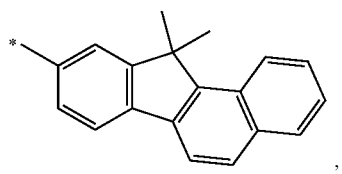 [SMILES: Cc1ccc2c(c1)C(C)(C)c1c-2ccc2ccccc12]

but is not limited thereto, wherein * is a binding site.

For example, the anthracene-based compound represented by Formula 400 may be one selected from compounds below, but is not limited thereto:

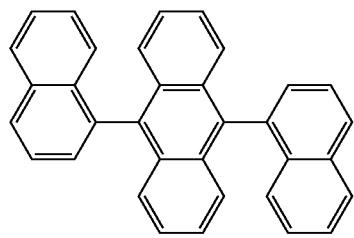

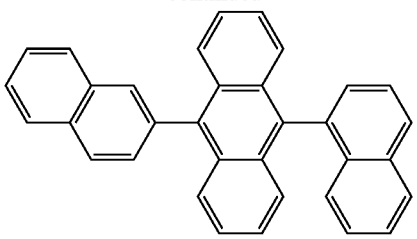

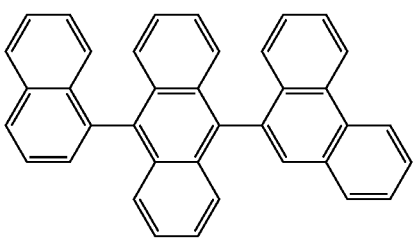

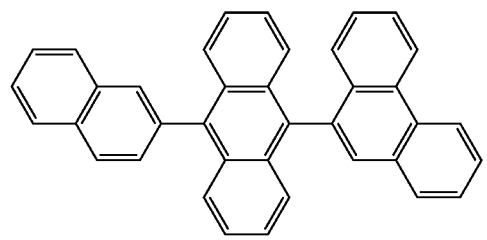

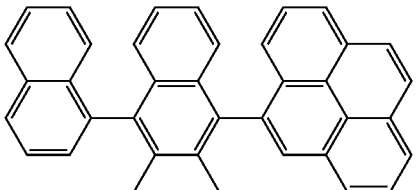

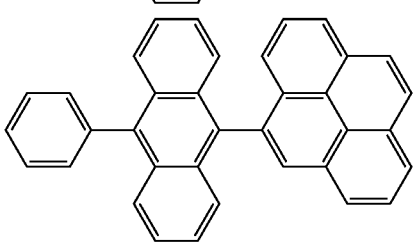

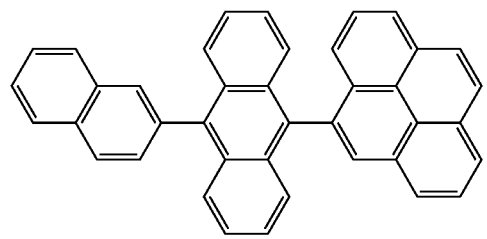

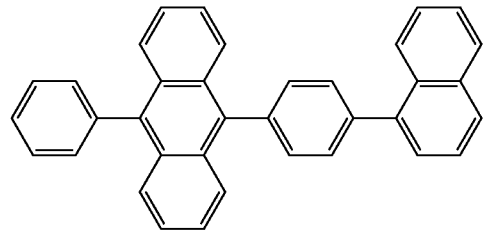

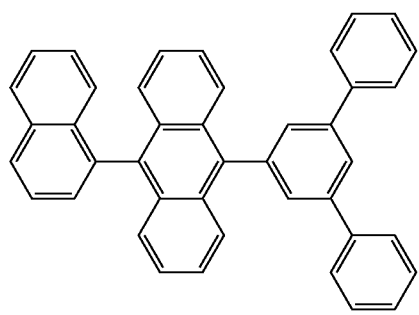
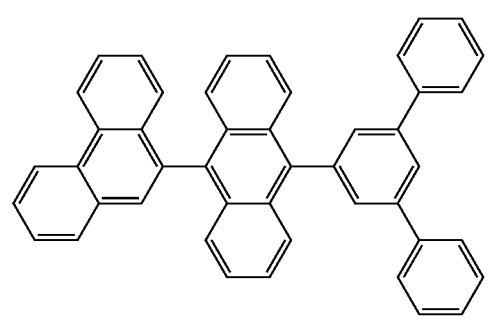
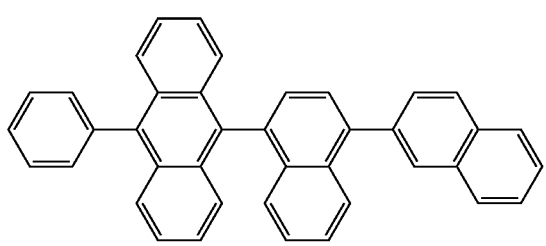
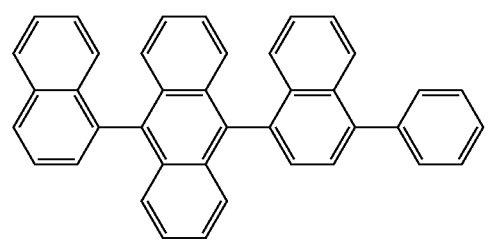
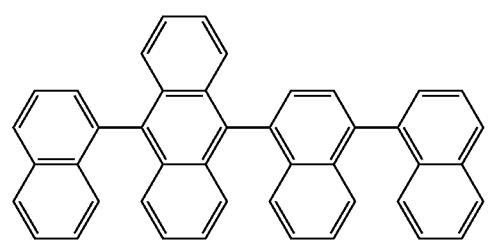
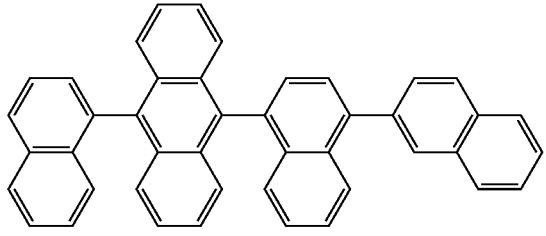
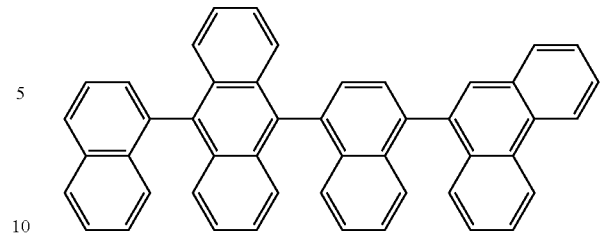
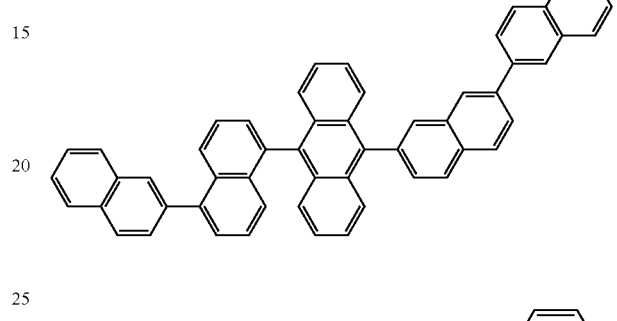
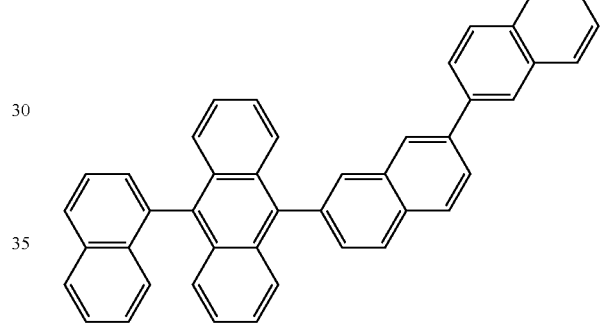
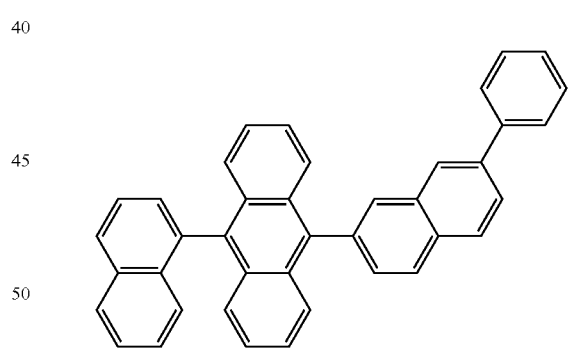
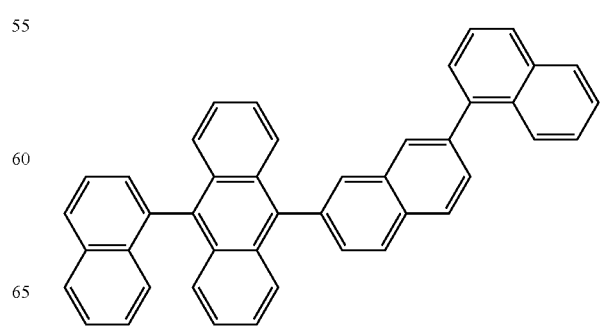

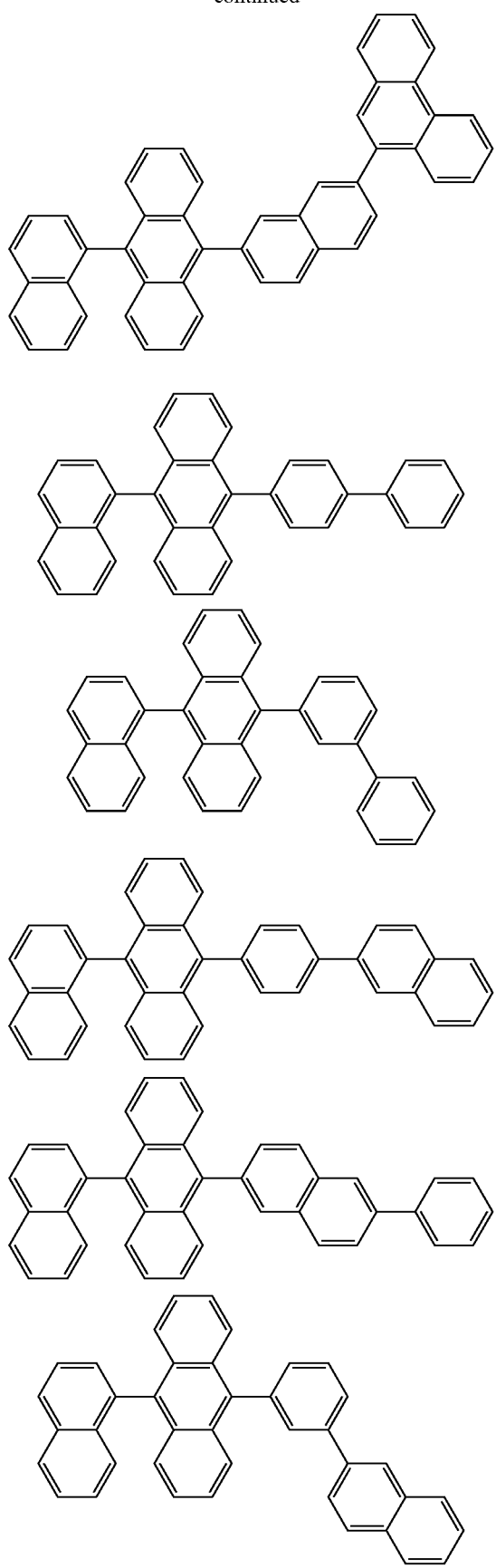
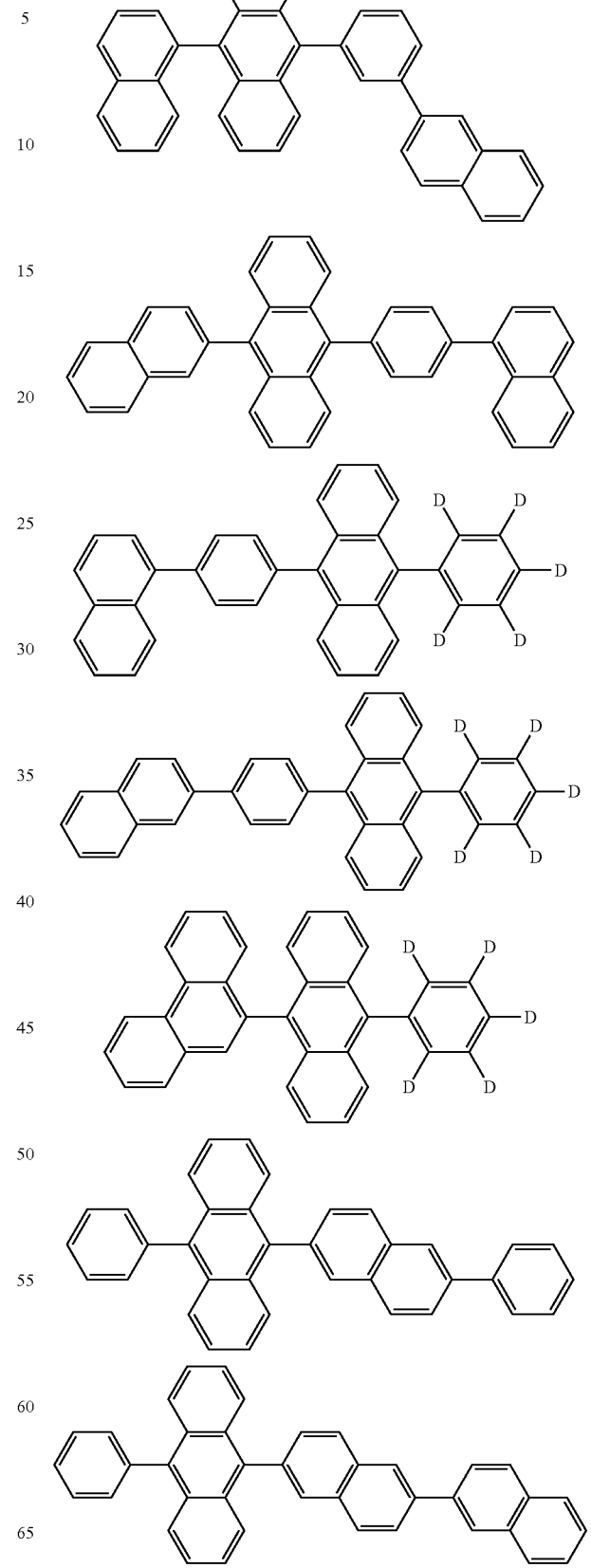

-continued

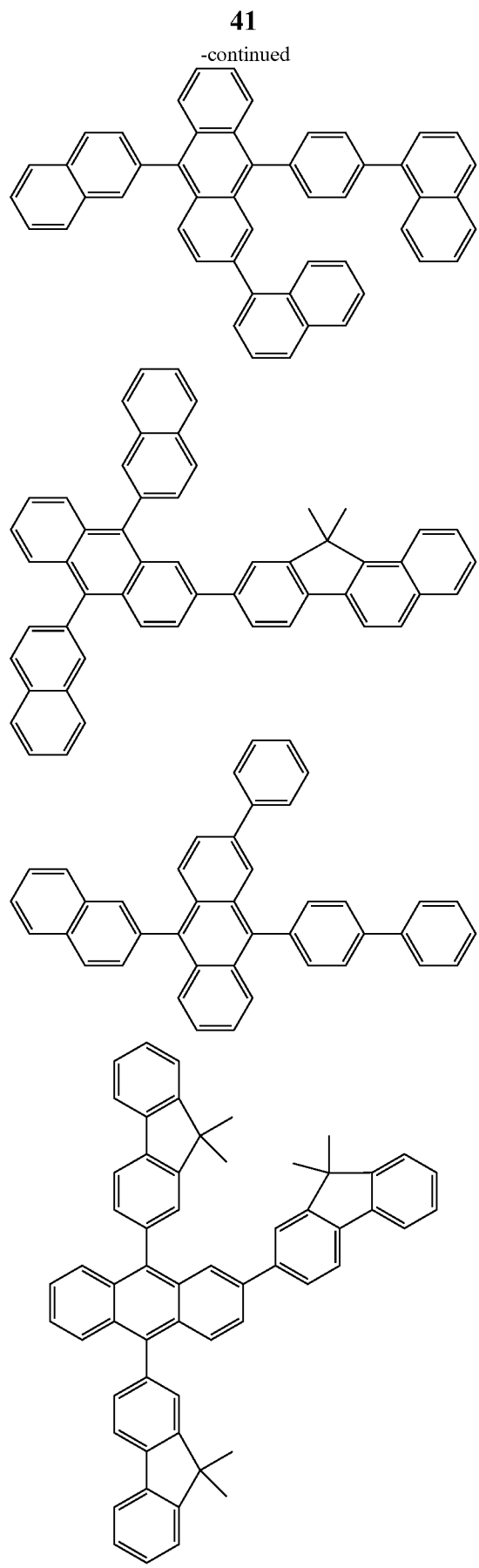

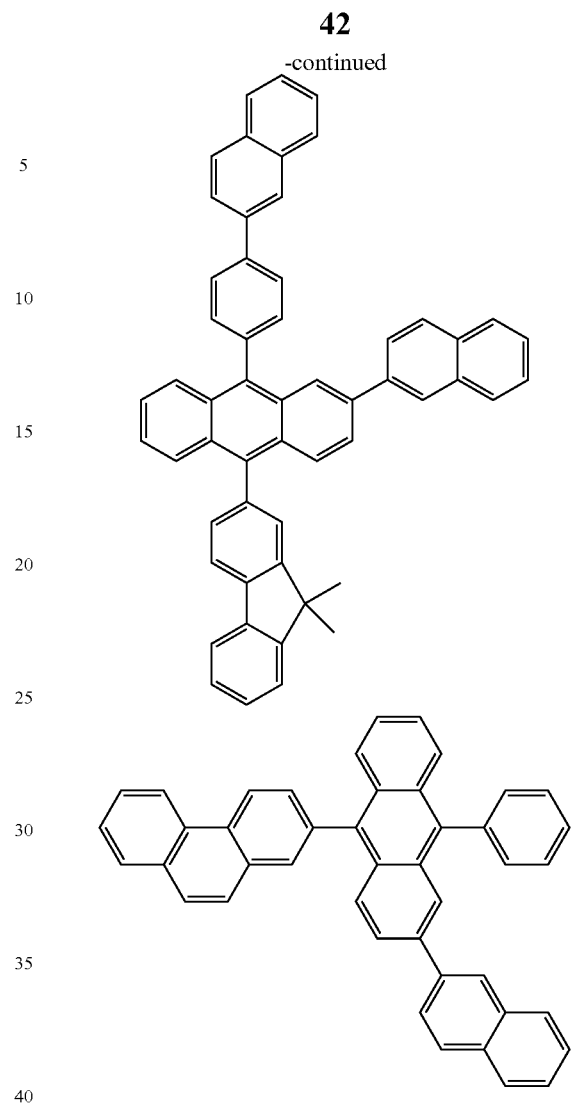

Also, the host may be an anthracene-based compound represented by Formula 401 below:

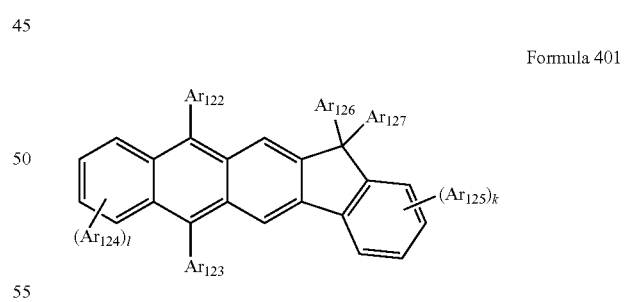

Formula 401

In Formula 401, descriptions of $Ar_{122}$ to $Ar_{125}$ may be referred to the description of $Ar_{113}$ of Formula 400 above (e.g., descriptions of $Ar_{122}$ to $Ar_{125}$ may be the same as those described above for $Ar_{113}$ of Formula 400).

In Formula 401, $Ar_{126}$ and $Ar_{127}$ may be each independently a $C_1$-$C_{10}$ alkyl group (e.g., a methyl group, an ethyl group, or a propyl group).

In Formula 401, k and l may be each independently an integer of 0 to 4. For example, k and l may be an integer of 0, 1, or 2.

For example, the anthracene-based compound represented by Formula 401 may be one of the compounds below, but is not limited thereto:

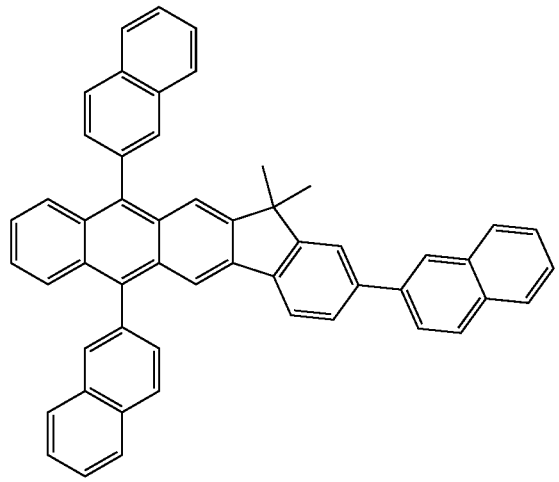

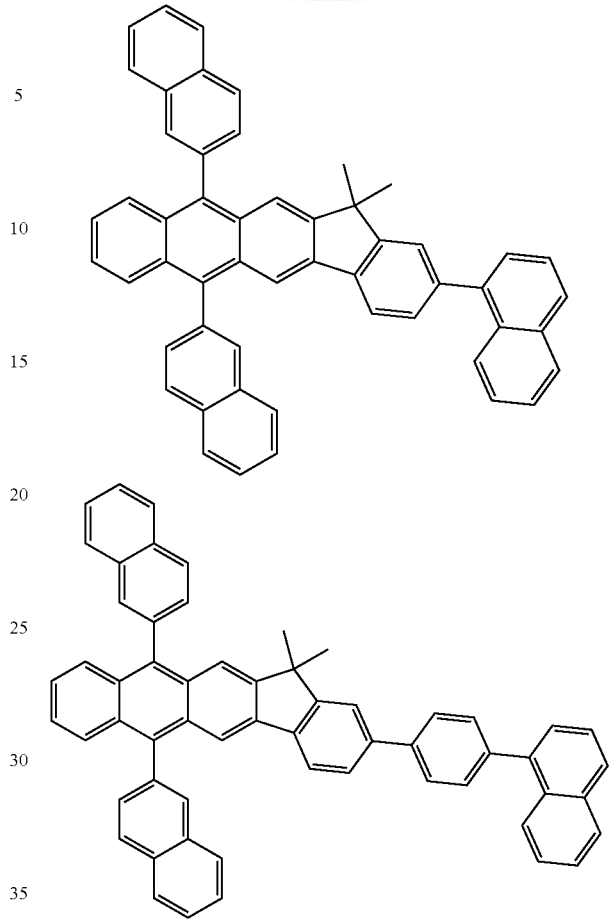

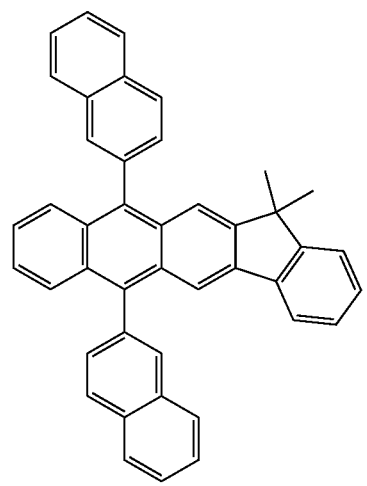

The known dopant may be at least one of a fluorescent dopant and a phosphorescent dopant. The phosphorescent dopant may be an organic metal complex including Ir, Pt, Os, Re, Ti, Zr, Hf, or a combination thereof, but is not limited thereto.

Non-limiting examples of a known blue dopant are $F_2Irpic$, $(F_2ppy)_2Ir(tmd)$, $Ir(dfppz)_3$, ter-fluorene, 4,4'-bis(4-diphenylaminostyryl)biphenyl (DPAVBi), 2,5,8,11-tetra-tert-butyl pherylene (TBPe), and DPVBi, but are not limited thereto.

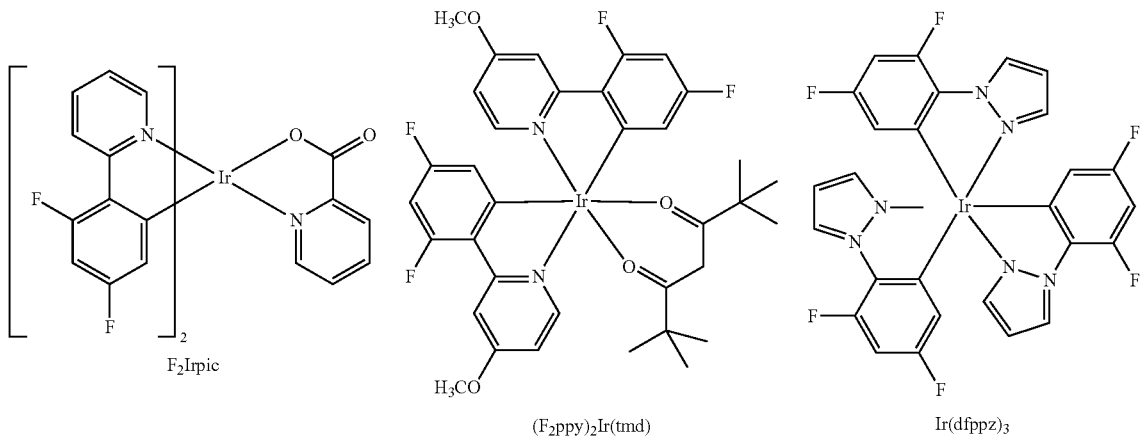

-continued
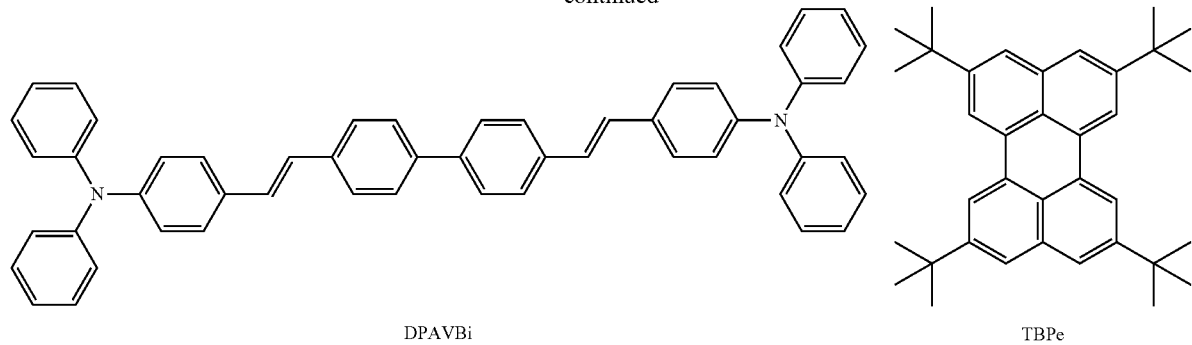
DPAVBi
TBPe
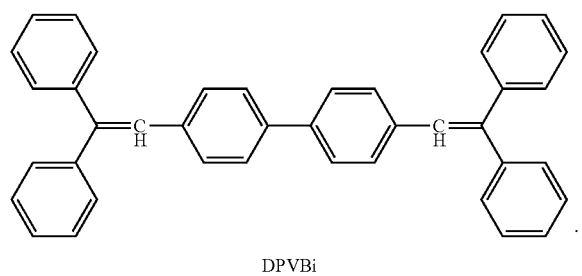
DPVBi
Non-limiting examples of a known red dopant are PtOEP, Ir(piq)₃, and BtpIr, but are not limited thereto.
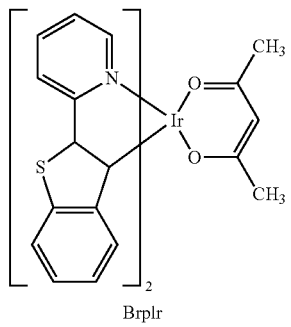
BtpIr
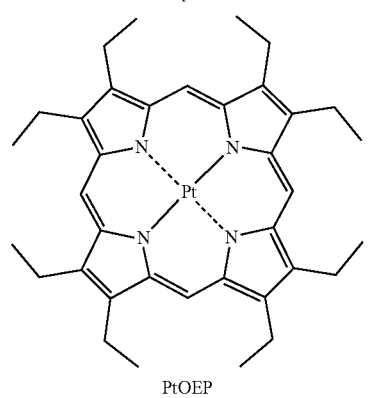
PtOEP
-continued
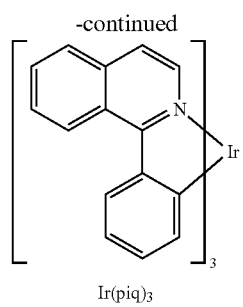
Ir(piq)₃
Non-limiting examples of a known green dopant are Ir(ppy)₃ (ppy=a phenylpyridine), Ir(ppy)₂(acac), and Ir(m-pyp)₃, but are not limited thereto.
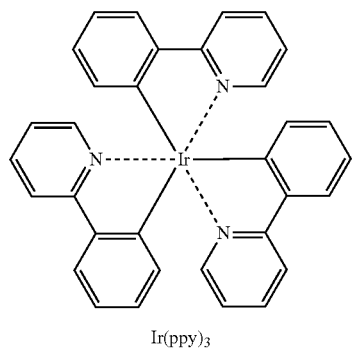
Ir(ppy)₃

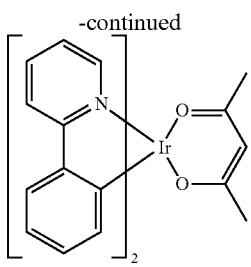

Ir(ppy)₂(acac)

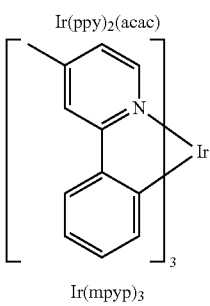

Ir(mpyp)₃

An amount of the dopant (i.e., the organometallic compound represented by Formula 1) in the EML may be generally in a range of about 0.01 parts to about 15 parts by weight based on about 100 parts by weight of the host, but is not limited thereto.

A thickness of the EML may be from about 100 Å to about 1000 Å, for example, from about 200 Å to about 600 Å. When the thickness of the EML is within either of the foregoing ranges, the EML may have good light emitting ability without a substantial increase in driving voltage.

Also, a HBL may be formed on the EML to prevent (or reduce) diffusion of triplet excitons or holes into an ETL. When the HBL is formed by vacuum deposition or spin coating, the conditions for deposition and coating may be similar to those for the formation of the HIL, although the conditions for deposition and coating may vary depending on the material that is used to form the HBL. Any suitable, known hole-blocking material may be used. Non-limiting examples of hole-blocking materials are oxadiazole derivatives, triazole derivatives, and phenanthroline derivatives. For example, bathocuproine (BCP) represented by the following formula may be used as a material for forming the HBL.

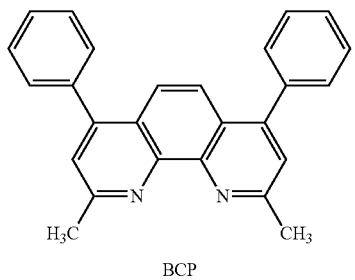 [SMILES: Cc1cc(-c2ccccc2)c2ccc3c(-c4ccccc4)cc(C)nc3c2n1 ; "BCP"]

BCP

A thickness of the HBL may be from about 20 Å to about 1000 Å, and in some embodiments, may be from about 30 Å to about 300 Å. When the thickness of the HBL is within either of the foregoing ranges, the HBL may have improved hole blocking ability without a substantial increase in driving voltage.

Next, an ETL is formed on the HBL by vacuum deposition, spin coating, casting, or the like. When the ETL is formed using vacuum deposition or spin coating, the deposition and coating conditions may be similar to those for the formation of the HIL, though the deposition and coating conditions may vary depending on the compound that is used to form the ETL. A material for forming the ETL may be any suitable, known material that can stably transport electrons injected from an electron injecting electrode (cathode). Non-limiting examples of materials for forming the ETL are quinoline derivatives, such as tris(8-hydroxyquinolinato)aluminum (Alq3), TAZ, BAlq, beryllium bis(benzoquinolin-10-olate) (Bebq₂), 9,10-di(naphthalene-2-yl)anthracene (ADN), BCP Compound 201 (shown below), and Compound 202 (shown below), but are not limited thereto.

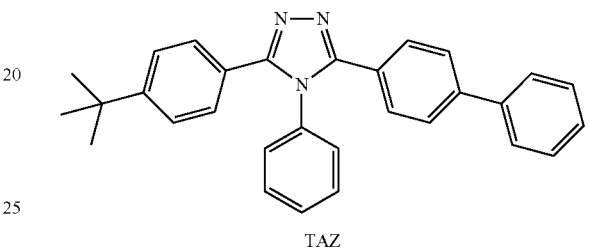

TAZ

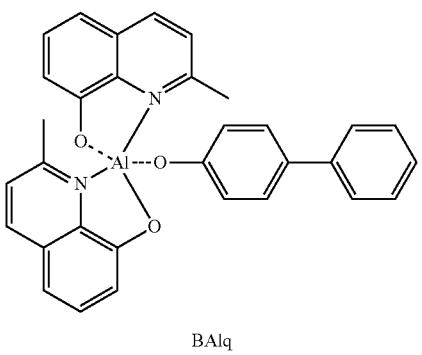

BAlq

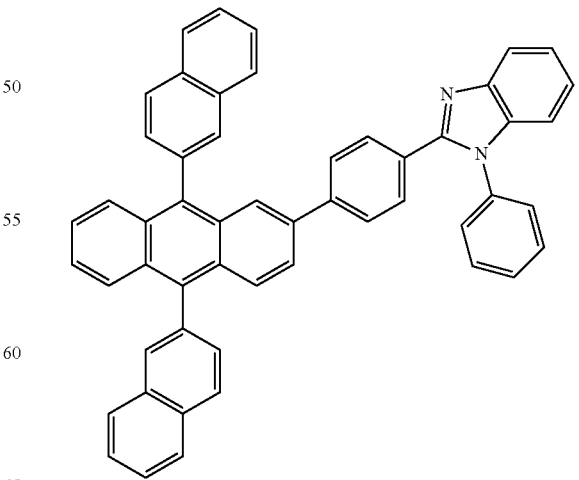

Compound 201

-continued

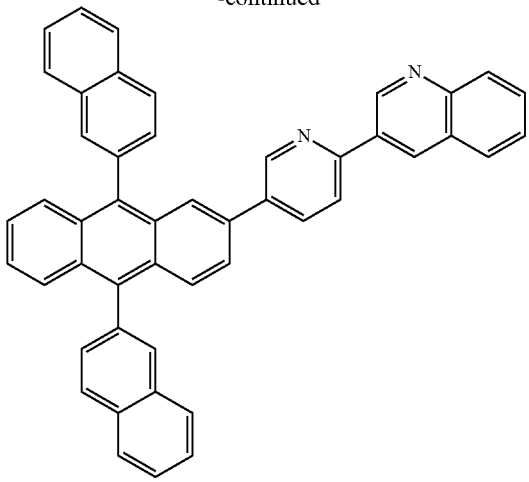

Compound 202

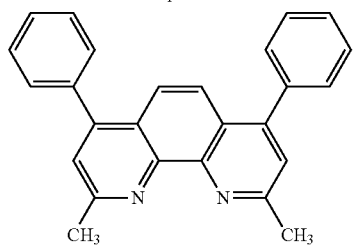

BCP

A thickness of the ETL may be from about 100 Å to about 1,000 Å, or in some embodiments, may be from about 150 Å to about 500 Å. When the thickness of the ETL is within either of the foregoing ranges, the ETL may have satisfactory electron transporting ability without a substantial increase in driving voltage.

In some embodiments the ETL may further include a metal-containing material, in addition to any suitable known electron-transporting organic compound.

The metal-containing compound may be a lithium (Li) compound. Non-limiting examples of the Li compound are lithium quinolate (LiQ) and Compound 203 below:

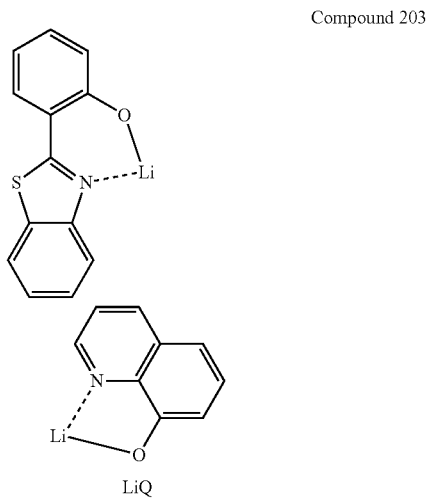

Compound 203

LiQ

In some embodiments, an EIL including a material that facilitates injection of electrons from the cathode may be disposed on the ETL, but the material of the EIL is not limited.

In some embodiments, the EIL material may include known EIL materials, such as LiF, NaCl, CsF, $Li_2O$, or BaO. Generally, the deposition or coating conditions may be similar to those used to form the HIL, although the deposition and coating conditions may vary according to the material that is used to form the EIL.

A thickness of the EIL may be from about 1 Å to 100 Å, or in some embodiments, may be from about 3 Å to about 90 Å. When the EIL has a thickness within either of the foregoing ranges, the EIL has good electron injection characteristics without substantially increasing driving voltage.

The second electrode 17 is disposed on the organic layer 15. The second electrode 17 may be a cathode that is an electron injection electrode. A material for forming the second electrode 17 may be a metal, an alloy, an electroconductive compound, which have a low work function, or a mixture thereof. In this regard, the second electrode 17 may be formed of lithium (Li), magnesium (Mg), aluminum (Al), aluminum (Al)-lithium (Li), calcium (Ca), magnesium (Mg)-indium (In), magnesium (Mg)-silver (Ag), or the like, and may be formed as a thin film type transmission electrode. In some embodiments, to manufacture a top-emission light-emitting device, the transmission electrode may be formed of indium tin oxide (ITO) or indium zinc oxide (IZO).

Although the OLED of FIG. 1 is described above, embodiments of the present invention are not limited thereto.

Hereinafter, the OLED according to an embodiment of the present invention will be described in detail with reference to the following synthesis examples and other examples. However, these examples are for illustrative purposes only and are not intended to limit the scope of the present invention.

As used herein, examples of the unsubstituted $C_1$-$C_{60}$ alkyl group (or a $C_1$-$C_{60}$ alkyl group) are linear or branched $C_1$-$C_{60}$ alkyl groups, including a methyl group, an ethyl group, a propyl group, an isobutyl group, a sec-butyl group, a pentyl group, an iso-amyl group, and a hexyl group. The substituted $C_1$-$C_{60}$ alkyl group refers to a $C_1$-$C_{60}$ alkyl group of which at least one hydrogen atom is substituted with one selected from a deuterium atom, a halogen atom, a hydroxyl group, a nitro group, a cyano group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_6$-$C_{60}$ aryl group, a $C_1$-$C_{60}$ heteroaryl group, $-N(Q_{11})(Q_{12})$, and $-Si(Q_{13})(Q_{14})(Q_{15})$ (here, $Q_{11}$ to $Q_{16}$ are each independently selected from the group consisting of a $C_1$-$C_{60}$ alkyl group, a $C_2$-$C_{60}$ alkenyl group, a $C_2$-$C_{60}$ alkynyl group, a $C_5$-$C_{60}$ aryl group, and a $C_1$-$C_{60}$ heteroaryl group).

As used herein, the unsubstituted $C_6$-$C_{60}$ aryl group is a monovalent group having a carbocyclic aromatic system having 6 to 60 carbon atoms including at least one aromatic ring. The unsubstituted $C_5$-$C_{60}$ arylene group is a divalent group having a carbocyclic aromatic system having 6 to 60 carbon atoms including at least one aromatic ring. When the aryl group and the arylene group have at least two rings, they may be fused to each other. At least one hydrogen atom in the aryl group and the arylene group may be substituted with those substituents described above in conjunction with the substituted $C_1$-$C_{60}$ alkyl group.

Examples of the substituted or unsubstituted $C_6$-$C_{60}$ aryl group include a phenyl group, a $C_1$-$C_{10}$ alkylphenyl group (e.g., an ethylphenyl group), a $C_1$-$C_{10}$ alkylbiphenyl group (e.g., an ethylbiphenyl group), a halophenyl group (e.g., an o-, m- or p-fluorophenyl group and a dichlorophenyl group), a dicyanophenyl group, a trifluoromethoxyphenyl group, an o-, m- or p-tolyl group, an o-, m- or p-cumenyl group, a mesityl group, a phenoxyphenyl group, a (α,α-dimethylbenzene)phenyl group, a (N,N'-dimethyl)aminophenyl group, a (N,N'-diphenyl)aminophenyl group, a pentalenyl group, an indenyl group, a naphthyl group, a halonaphthyl group (e.g., a fluoronaphthyl group), a $C_1$-$C_{10}$ alkylnaphthyl group (e.g., a methylnaphthyl group), a $C_1$-$C_{10}$ alkoxynaphthyl group (e.g., a methoxynaphthyl group), an anthracenyl group, an azulenyl group, a heptalenyl group, an acenaphthylenyl group, a phenalenyl group, a fluorenyl group, an anthraquinolyl group, a methylanthryl group, a phenanthryl group, a triphenylenyl group, a pyrenyl group, a chrysenyl group, an ethyl-chrysenyl group, a picenyl group, a perylenyl group, a chloroperylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, and an ovalenyl group. Examples of the substituted $C_5$-$C_{60}$ aryl group may be easily understood based on those of the unsubstituted $C_5$-$C_{60}$ aryl group and the substituted $C_1$-$C_{60}$ alkyl group described above. Examples of the substituted or unsubstituted $C_5$-$C_{60}$ arylene group may be easily understood based on those examples of the substituted or unsubstituted $C_5$-$C_{60}$ aryl group described above.

As used herein, the unsubstituted $C_1$-$C_{60}$ heteroaryl group is a monovalent group having at least one aromatic ring having at least one heteroatom selected from the group consisting of N, O, P, and S as a ring-forming atom. The unsubstituted $C_1$-$C_{60}$ heteroarylene group is a divalent group having at least one aromatic ring having at least one heteroatom selected from the group consisting of N, O, P, and S. In this regard, when the heteroaryl group and the heteroarylene group have at least two rings, they may be fused to each other. At least one hydrogen atom in the heteroaryl group and the heteroarylene group may be substituted with those substituents described with reference to the $C_1$-$C_{60}$ alkyl group.

Examples of the unsubstituted $C_1$-$C_{60}$ heteroaryl group include a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, a benzoimidazolyl group, an imidazopyridinyl group and an imidazopyrimidinyl group. Examples of the substituted or unsubstituted $C_1$-$C_{60}$ heteroarylene group may be easily understood based on those examples of the substituted or unsubstituted $C_2$-$C_{60}$ arylene group described above.

Synthesis Example 1: Synthesis of Compound 1

Compound 1 was synthesized by way of intermediate 1(1) according to Reaction Scheme 1 below:

Reaction Scheme 1

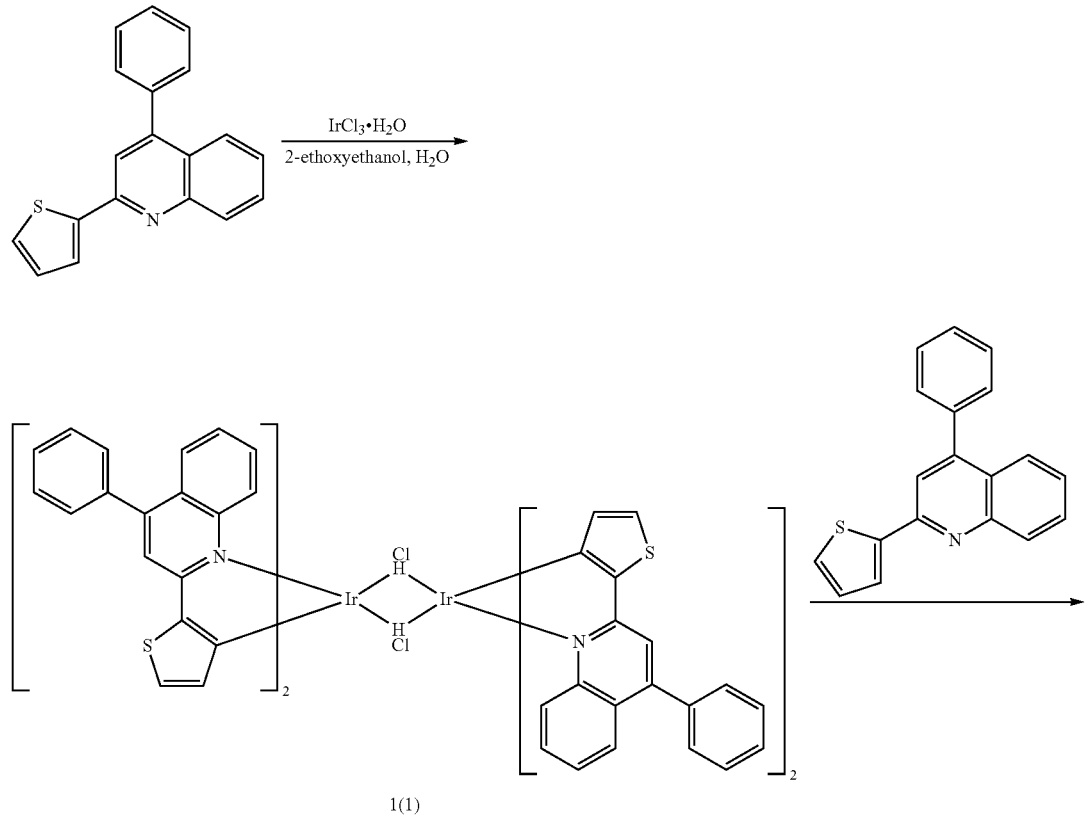

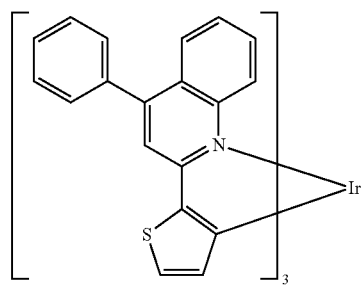

Synthesis of Intermediate 1(1)

5.0 g (17.5 mmol) of 2-(4-phenylnaphthalen-2-yl)thiophene was dissolved in 45 mL of 2-ethoxyethanol, 2.4 g (7.6 mmol) of iridium chloride hydrate and 15 mL of distilled water were added thereto to obtain a reaction mixture, and then the reaction mixture was stirred at a temperature of 130 t for 20 hours. After the reaction was completed, the reaction mixture was cooled to room temperature, and then the precipitate was filtered, washed with methanol, and then dried in vacuum to obtain 6.6 g (4.56 mmol) of Intermediate 1(1) (yield: 41%).

Synthesis of Compound 1

1.7 g (1.05 mmol) of Intermediate 1(1), 0.69 g (2.44 mmol) of 2-(4-phenylnaphthalene-2-yl)thiophene, and 0.34 g (2.46 mmol) of $K_2CO_3$ were added to 30 mL of 2-ethoxyethanol and stirred at a temperature of 130° C. for 20 hours to obtain a reaction mixture. After the reaction was completed, the reaction mixture was cooled to room temperature, and then the precipitate was filtered and washed with methanol. The precipitate was dissolved in dicholoromethane and filtered by using a short pad. While re-boiling the filtered dicholoromethane solution, methanol was added at a small amount at a time to precipitate Compound 1, and thus 0.70 g of Compound 1 (yield: 66%) was obtained. Compound 1 was confirmed by APCI-MS and $^1$H NMR.

$^1$H-NMR: 8.06 (3H), 7.97 (3H), 7.92 (3H), 7.79 (12H), 7.60 (3H), 7.51 (6H), 7.41 (3H), 7.25 (3H)

APCI-MS (m/z): 757[M+] 1053.5

Synthesis Example 2: Synthesis of Compound 2

0.65 g of Compound 2 (yield: 73%) was synthesized in the same manner as in Synthesis Example 1, except that 0.29 g (2.44 mmol) of benzoic acid was used instead of 2-(4-phenylnaphthalene-2-yl)thiophene. Compound 2 was confirmed by APCI-MS and $^1$H NMR.

Synthesis Example 3: Synthesis of Compound 3

0.63 g of Compound 3 (yield: 71%) was synthesized in the same manner as in Synthesis Example 1, except that 0.28 g (2.44 mmol) of acetylacetonate was used instead of 2-(4-phenylnaphthalene-2-yl)thiophene. Compound 3 was confirmed by APCI-MS and $^1$H NMR.

$^1$H-NMR: 8.55 (2H), 8.04 (4H), 7.79 (4H), 7.92 (2H), 7.69 (2H), 7.55 (4H), 7.51 (4H), 7.41 (2H), 7.26 (2H), 5.75 (1H), 4.06 (1H), 2.24 (2H)

APCI-MS (m/z): 757[M+] 878.1

Example 1

To manufacture an anode, a corning 15 $\Omega/cm^2$ (1200 Å) ITO glass substrate was cut to a size of 50 mm×50 mm×0.7 mm and then sonicated in isopropyl alcohol and pure water each for five minutes, and then cleaned by irradiation of ultraviolet rays for 30 minutes and exposure to ozone. The resulting glass substrate was loaded into a vacuum deposition device.

2-TNATA was vacuum deposited on the ITO to form a HIL having a thickness of about 600 Å. NPB was vacuum deposited on the HIL to form a HTL having a thickness of 300 Å.

CBP and Compound 1 were co-deposited on the HTL at a weight ratio of 98:2 to form an EML having a thickness of 400 Å.

Compound 101 was vacuum deposited on the EML to form an ETL having a thickness of 300 Å, LiF was vacuum deposited on the ETL to form an EIL having a thickness of 10 Å, and then Al was vacuum deposited on the EIL to form a cathode having a thickness of 3000 Å, thereby completing the manufacture of an OLED.

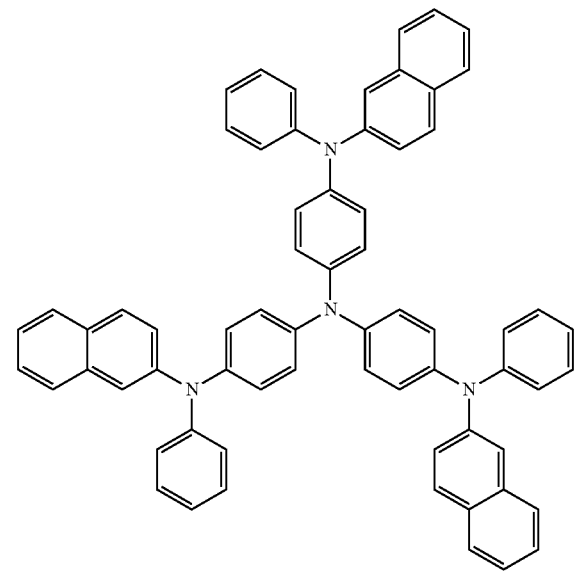

2-TNATA

-continued

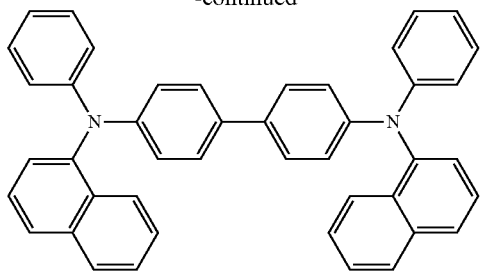

NPB

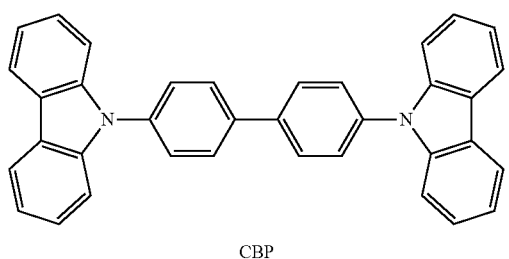

CBP

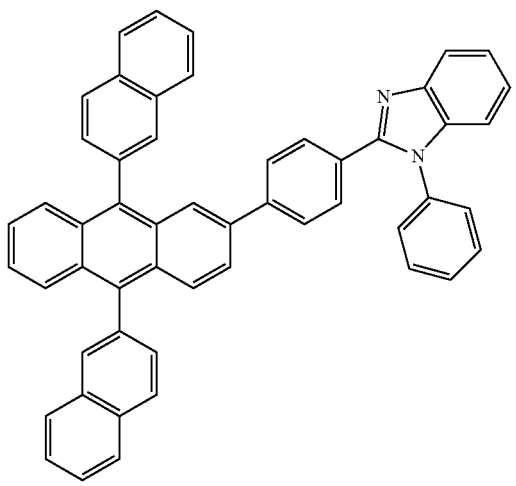

Compound 101

Example 2

An OLED was manufactured in the same manner as in Example 1, except that Compound 2 was used instead of Compound 1 to form the EML.

Example 3

An OLED was manufactured in the same manner as in Example 1, except that Compound 3 was used instead of Compound 1 to form the EML.

Comparative Example 1

An OLED was manufactured in the same manner as in Example 1, except that Compound A below was used instead of Compound 1 to form the EML.

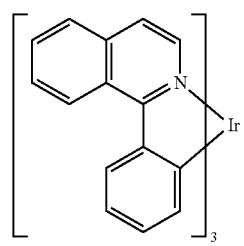

Compound A

Comparative Example 2

An OLED was manufactured in the same manner as in Example 1, except that Compound B below was used instead of Compound 1 to form the EML.

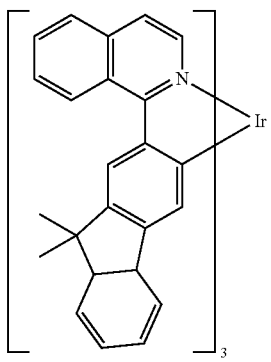

Compound B

Comparative Example 3

An OLED was manufactured in the same manner as in Example 1, except that Compound C below was used instead of Compound 1 to form the EML.

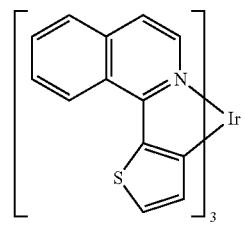

Compound C

Evaluation Example 1

Driving voltages, current densities, luminances, efficiencies, and color-purities of the OLEDs manufactured in Examples 1 to 3 and Comparative Examples 1 to 3 were evaluated by using a PR650 Spectroscan Source Measurement Unit (available from PhotoResearch). The results are shown in Table 1 below.

TABLE 1

| | Dopant | Driving voltage at 10 mA/m$^2$ | Efficiency (cd/A) at 10 mA/m$^2$ |
|---|---|---|---|
| Example 1 | Compound 1 | 5.7 | 24.3 |
| Example 2 | Compound 2 | 5.3 | 23.2 |
| Example 3 | Compound 3 | 5.5 | 22.1 |
| Comparative Example 1 | Compound A | 6.6 | 18.6 |
| Comparative Example 2 | Compound B | 6.7 | 15.3 |
| Comparative Example 3 | Compound C | 5.8 | 20.8 |

Referring to Table 1, the OLEDs manufactured in Examples 1 to 3 were found to have better driving voltages and efficiencies, compared to those of the OLEDs manufactured in Comparative Examples 1 to 3.

As described above, according to one or more of the above embodiments of the present invention, an OLED including the organometallic compound of Formula 1 may have a low driving voltage, high efficiency, high luminance, and a long lifespan.

It should be understood that the embodiments described herein should be considered in a descriptive sense only and not for purposes of limitation. The present disclosure is intended to cover various modifications and equivalent arrangements included within the spirit and scope of the appended claims, and equivalents thereof. Features or aspects described with respect to each embodiment should typically be considered as being available for other similar features or aspects in other embodiments.

What is claimed is:

1. An organometallic compound, the organometallic compound being represented by Formula 1 below:

Formula 1

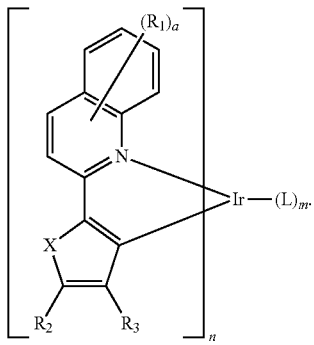

wherein, in Formula 1, $R_1$ is selected from a substituted or unsubstituted $C_6$-$C_{20}$ aryl group, and a substituted or unsubstituted $C_1$-$C_{20}$ heteroaryl group;

a is an integer of 1 to 6, wherein when a is 2 or greater, Formula 1 comprises a plurality of $R_1$s, and the $R_1$s are identical to or different from each other;

X is a sulfur atom;

$R_2$ and $R_3$ are each independently selected from a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_1$-$C_{60}$ heteroaryl group, and —CO($Q_1$), $Q_1$ being a substituted or unsubstituted $C_1$-$C_{30}$ alkyl group or a substituted or unsubstituted $C_6$-$C_{60}$ aryl group;

n is an integer of 1 to 3, wherein when n is 2 or greater, Formula 1 comprises a plurality of

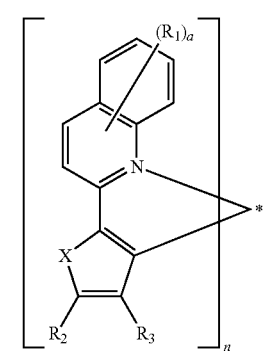

s, and each

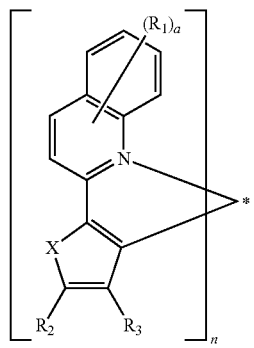

is identical to or different from each other;

L is an organic ligand; and m is an integer of 0 to 2, wherein when m is 2, Formula 1 comprises two Ls, and the Ls are identical to or different from each other.

2. The organometallic compound of claim 1, wherein $R_1$ is selected from, a phenyl group, a naphthyl group, a phenanthryl group, an anthryl group, a pyrenyl group, a chrysenyl group, a fluorenyl group, a pyridyl group, a pyrimidyl group, a triazinyl group, a quinolinyl group, an isoquinolinyl group, a carbazolyl group, a dibenzofuranyl group, and a dibenzothiophenyl group;

a phenyl group, a naphthyl group, a phenanthryl group, an anthryl group, a pyrenyl group, a chrysenyl group, a fluorenyl group, a pyridyl group, a pyrimidyl group, a triazinyl group, a quinolinyl group, an isoquinolinyl group, a carbazolyl group, a dibenzofuranyl group, and a dibenzothiophenyl group, each substituted with at least one of, a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, and a $C_1$-$C_{60}$ alkyl group;

a $C_1$-$C_{60}$ alkyl group substituted with at least one of a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, and a $C_1$-$C_{60}$ heteroaryl group; and a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, and a $C_1$-$C_{60}$ heteroaryl group, each substituted with at least one of a deuterium atom, a halogen atom, a hydroxyl group, a cyano group, a nitro group, an amino group, an amidino group, a hydrazine group, a hydrazone group, a carboxylic acid group or, a salt thereof, a sulfonic acid group or a salt thereof, a phosphoric acid group or a salt thereof, a $C_1$-$C_{60}$ alkyl group, a phenyl group, a naphthyl group, an anthryl group, a fluorenyl group, a dimethylfluorenyl group, a diphenylfluorenyl group, a carbazolyl group, a phenylcarbazolyl group, a pyridyl group, a pyrimidyl group, a pyrazinyl group, a pyridazinyl group, a triazinyl group, a quinolinyl group, and an isoquinolinyl group.

3. The organometallic compound of claim 1, wherein $R_1$ is selected from, a phenyl group, a naphthyl group, a phenanthryl group, and an anthryl group;

a phenyl group, a naphthyl group, a phenanthryl group, and an anthryl group, each substituted with at least one of, a deuterium atom, a fluorine atom, a cyano group, a nitro group, a methyl group, an ethyl group, an n-propyl group, an i-propyl group, an n-butyl group, an i-butyl group, and a t-butyl group; and a methyl group, an ethyl group, an n-propyl group, an i-propyl group, an n-butyl group, an i-butyl group, and a t-butyl group, each substituted with at least one of a deuterium atom and a fluorine atom;

a phenyl group, a naphthyl group, a phenanthryl group, and an anthryl group; and a phenyl group, a naphthyl group, a phenanthryl group, and an anthryl group, each substituted with at least one of a deuterium atom, —F, a methyl group, an ethyl group, an n-propyl group, an i-propyl group, an n-butyl group, an i-butyl group, and a t-butyl group.

4. The organometallic compound of claim 1, wherein $R_1$ is selected from a phenyl group; and a phenyl group substituted with at least one of a deuterium, atom, a fluorine atom, a methyl group, an ethyl group, an n-propyl group, an i-propyl group, an n-butyl group, an i-butyl group, and a t-butyl group.

5. The organometallic compound of claim 1, wherein $R_1$ is a phenyl group.

6. The organometallic compound of claim 1, wherein $R_2$ and $R_3$ are each independently selected from a hydrogen atom, a deuterium atom, a halogen atom, a substituted or unsubstituted $C_1$-$C_{60}$ alkyl group, a substituted or unsubstituted $C_6$-$C_{60}$ aryl group, a substituted or unsubstituted $C_1$-$C_{60}$ heteroaryl group, and —CO($Q_1$), $Q_1$ being selected from a substituted or unsubstituted methyl group, a substituted or unsubstituted ethyl group, a substituted or unsubstituted phenyl group, a substituted or unsubstituted naphthyl group, a substituted or unsubstituted phenanthryl group, a substituted or unsubstituted anthryl group, a substituted or unsubstituted pyridyl group, a substituted or unsubstituted pyrimidyl group, a substituted or unsubstituted triazinyl group, and a substituted or unsubstituted carbazolyl group.

7. The organometallic compound of claim 1, wherein $R_2$ and $R_3$ are each independently selected from, a hydrogen atom, a deuterium atom, a fluorine atom, a cyano group, and a nitro group;

a methyl group, an ethyl group, an n-propyl group, an i-propyl group, an n-butyl group, an i-butyl group, and a t-butyl group, each substituted with at least one of a hydrogen atom, a deuterium atom, a fluorine atom, a cyano group, and a nitro group; and a phenyl group, a naphthyl group, a phenanthryl group, an anthryl group, a pyridyl group, a pyrimidyl group, a triazinyl group, a quinolinyl group, and an isoquinolinyl group, each substituted with at least one of a hydrogen atom, a deuterium atom, a fluorine atom, a cyano group, a nitro group, a methyl group, and an ethyl group.

8. The organometallic compound of claim 1, wherein $R_2$ and $R_3$ are each independently selected from a hydrogen atom, a deuterium atom, a fluorine atom, and —$CF_3$.

9. The organometallic compound of claim 1, wherein n is an integer of 2 or 3.

10. The organometallic compound of claim 1, wherein L is represented by one selected from Formulae 2a to 2e below:

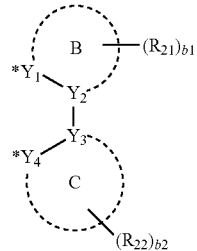

Formula 2a

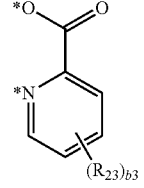

Formula 2b

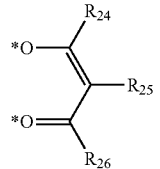

Formula 2c

-continued

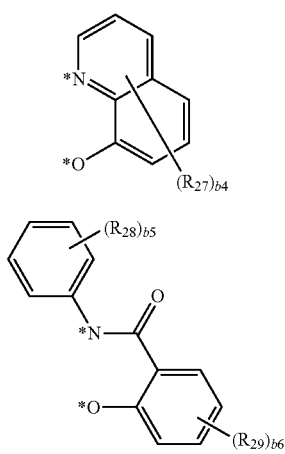

Formula 2d

Formula 2e wherein, in Formulae 2a to 2e,
$Y_1$ to $Y_4$ are each independently a carbon atom or a nitrogen atom;
a ring B and a ring C are each independently selected from a $C_4$-$C_{20}$ alicyclic ring, a $C_2$-$C_{20}$ hetero alicyclic ring, a $C_6$-$C_{20}$ aromatic ring, and a $C_1$-$C_{20}$ heteroaromatic ring;
$R_{21}$ to $R_{29}$ are each independently selected from a hydrogen atom, a deuterium atom, a halogen atom, a substituted or unsubstituted $C_1$-$C_{60}$ alkyl group, and a substituted or unsubstituted $C_6$-$C_{60}$ aryl group;
b1 to b6 are each independently an integer of 0 to 4; and
* is a binding site to the iridium atom of Formula 1.

11. The organometallic compound of claim 1, wherein L is represented by one selected from Formulae 2a to 2c below:

Formula 2a

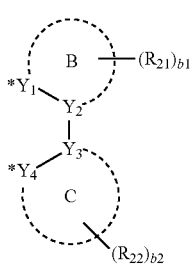

Formula 2b

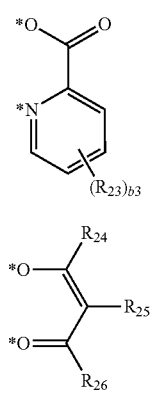

Formula 2c

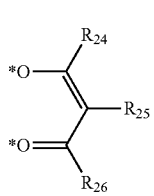

wherein, in Formulae 2a to 2c,
$Y_1$ to $Y_4$ are each independently a carbon atom or a nitrogen atom;

a ring B is selected from a pyridine, a pyrazine, a pyrimidine, a pyrrole, an imidazole, an oxazole, a thiazole, an isoquinoline, a quinoline, a benzoimidazole, a benzoxazole, and a benzothiazole;
a ring C is a phenyl;
$R_{21}$ to $R_{26}$ are each independently selected from a hydrogen atom, a deuterium atom, a fluorine atom, a methyl group, a t-butyl group, and —$CF_3$;
b1 to b3 are each independently an integer of 0 to 2; and
* is a binding site to the iridium atom of Formula 1.

12. The organometallic compound of claim 1, wherein L is represented by one selected from Formulae 2g to 2i below:

Formula 2g

Formula 2h

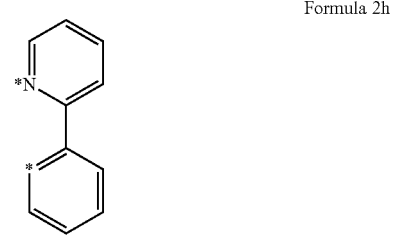

Formula 2i

wherein, in Formula 2g to 2i,
* is a binding site to the iridium atom of Formula 1.

13. The organometallic compound of claim 1, wherein m is an integer of 0 or 1.

14. The organometallic compound of claim 1, wherein the organometallic compound is represented by one selected from Formulae 3a to 3b below:

Formula 3a

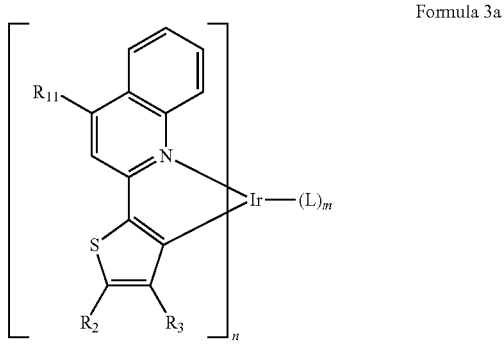

Formula 3b

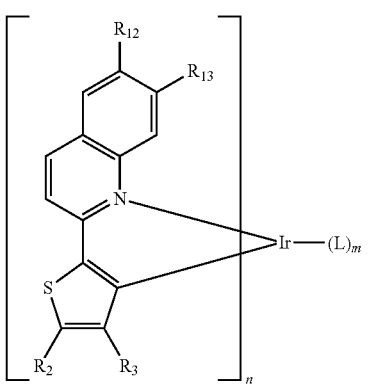

wherein, in Formulae 3a to 3b, $R_{11}$ to $R_{13}$ are each independently selected from,
a phenyl group; and
a phenyl group substituted with at least one of a deuterium atom, a fluorine atom, a methyl group, an ethyl group, an n-propyl group, an i-propyl group, an n-butyl group, an i-butyl group, and a t-butyl group;

$R_2$ and $R_3$ are each independently selected from a hydrogen atom, a deuterium atom, a fluorine atom, and —$CF_3$;

n is an integer of 2 or 3; and

L is represented by one selected from Formulae 2g to 2i below:

Formula 2g

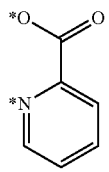

Formula 2h

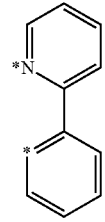

Formula 2i

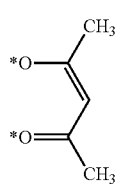

wherein, in Formulae 2g to 2i,

* is a binding site to an iridium atom of any one of Formulae 3a to 3b; and m is an integer of 0 or 1.

15. The organometallic compound of claim 1, wherein the organometallic compound is represented by one of Compounds 1 to 7 below:

Compound 1

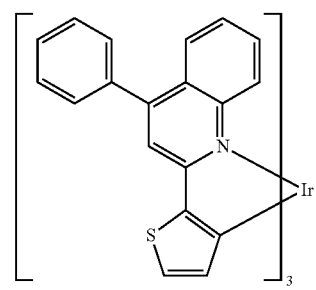

Compound 2

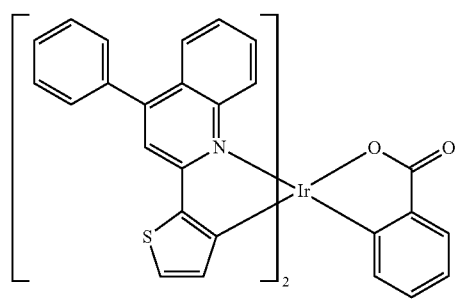

Compound 3

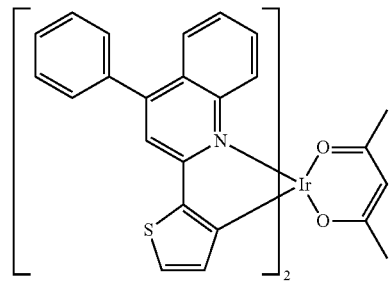

Compound 4

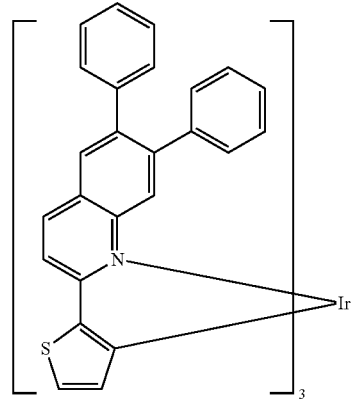

-continued

Compound 5

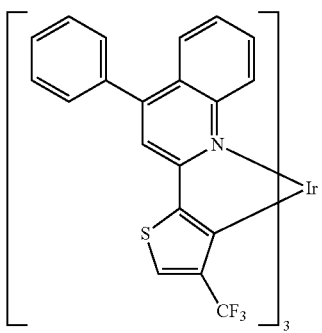

Compound 6

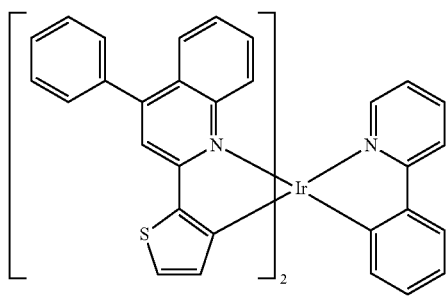

-continued

Compound 7

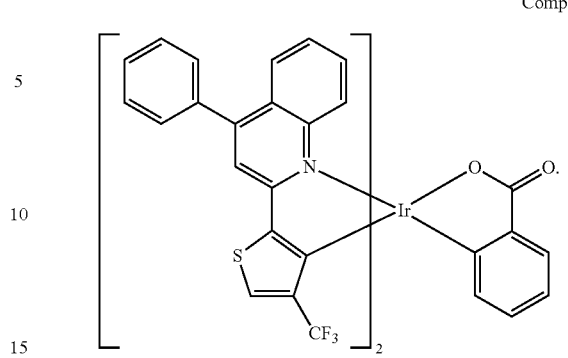

16. An organic light-emitting device (OLED), the OLED comprising: a first electrode; a second electrode facing the first electrode; and an organic layer between the first electrode and the second electrode and comprising an emission layer, wherein the organic layer comprises at least one of the organometallic compound of claim 1.

17. The OLED of claim 16, wherein the organic layer comprises a hole transport region between the first electrode and the emission layer, and the hole transport region comprises at least one of a hole injection layer, a hole transport layer, a functional layer having a hole injection capability and a hole transport capability, a buffer layer, and an electron blocking layer, and wherein the organic layer further comprises an electron transport region between the emission layer and the second electrode, and the electron transport region comprises at least one of a hole blocking layer, an electron transport layer, and an electron injection layer.

18. The OLED of claim 17, wherein the emission layer comprises the organometallic compound, and wherein the emission layer further comprises a host, and the organometallic compound serves as a phosphorescent dopant.

* * * * *